United States Patent
Whittaker et al.

(10) Patent No.: US 6,891,493 B2
(45) Date of Patent: May 10, 2005

(54) LOW POWER ANALOG TO DIGITAL CONVERTER

(75) Inventors: Dennis R. Whittaker, Tampa, FL (US); Parker A. Robinson, Clearwater, FL (US); James W. Wall, Tampa, FL (US)

(73) Assignee: Insyte Innovation Systems, St. Petersburg, FL (US)

( * ) Notice: Subject to any disclaimer, the term of this patent is extended or adjusted under 35 U.S.C. 154(b) by 0 days.

(21) Appl. No.: 10/645,650

(22) Filed: Aug. 20, 2003

(65) Prior Publication Data

US 2004/0113826 A1 Jun. 17, 2004

Related U.S. Application Data

(63) Continuation of application No. 09/632,312, filed on Aug. 4, 2000, now Pat. No. 6,633,249.
(60) Provisional application No. 60/147,693, filed on Aug. 6, 1999.

(51) Int. Cl.[7] .................................................. H03M 1/12
(52) U.S. Cl. ...................................... 341/156; 341/158
(58) Field of Search ................................ 341/158, 122, 341/156, 155, 120

(56) References Cited

U.S. PATENT DOCUMENTS

| | | | | |
|---|---|---|---|---|
| 4,218,675 A | * | 8/1980 | Shaw et al. ................. | 341/156 |
| 4,345,241 A | * | 8/1982 | Takeuchi et al. ............ | 341/118 |
| 4,719,447 A | * | 1/1988 | Garuts ......................... | 341/159 |
| 4,819,070 A | * | 4/1989 | Hynecek ...................... | 348/302 |
| 5,070,332 A | * | 12/1991 | Kaller et al. ................ | 341/156 |
| 5,117,206 A | * | 5/1992 | Imamura ..................... | 331/158 |
| 5,973,632 A | * | 10/1999 | Tai .............................. | 341/156 |
| 6,011,502 A | * | 1/2000 | Kao ............................ | 341/156 |
| 6,121,912 A | * | 9/2000 | Brandt ........................ | 341/156 |
| 6,285,095 B1 | * | 9/2001 | Becker et al. .............. | 307/125 |
| 6,628,224 B1 | * | 9/2003 | Ward et al. ................. | 341/156 |

* cited by examiner

*Primary Examiner*—Peguy JeanPierre
(74) *Attorney, Agent, or Firm*—Glenn Patent Group; Michael A. Glenn

(57) ABSTRACT

An improved analog to digital converter is disclosed incorporating a flash converter and a charge-sharing pipelined chain converter. The invention incorporates three important circuits including a novel voltage reference steering circuit, a novel high performance low power comparator circuit and a novel digital calibration for compensation circuit. The low power is accomplished by turning on compare circuits only when comparing (controlled by timing circuits that are common to all comparators) and by a low power RAM that properly aligns the converted data. The converter operates in a pipelined manor and requires multiple sample and hold circuits for the compare circuits. The improved analog to digital converter incorporates test and calibration to compensate for variations experience during operation and manufacture of the improved analog to digital converter.

17 Claims, 14 Drawing Sheets

LOW POWER ANALOG TO DIGITAL CONVERTER

CROSS-REFERENCE TO RELATED APPLICATIONS

This application is a Continuation of U.S. patent application Ser. No. 09/632,312 filed Aug. 4, 2000 now U.S. Pat. No. 6,633,249.

This application claims the benefit of Provisional Application No. 60/147,693, filed Aug. 6, 1999.

BACKGROUND OF THE INVENTION

1. Field of the Invention

This invention relates to electrical converters and more particularly to an improved low power analog to digital converter.

2. Background of the Invention

The process of converting an analog signal to a digital signal has been well known to the prior art for a number of years. In general, a process of converting an analog signal into a digital signal comprises measuring the amplitude of the analog signal at consistent time intervals and producing a set of signals representing the measured digital value. The information in the digital signals and the known time interval enables one to convert the digital signal back to the analog signal.

The prior art has known many types of apparatus circuits and the like for accomplishing the process of an analog to digital conversion of an electrical signal. In a typical analog to digital converter, the amplitude of an analog signal is compared to a standard signal during predetermined durations of time known as a sampling period. One specific type of analog to digital converter is commonly referred to as a two-stage flash, pipelined analog to digital converter.

U.S. Pat. No. 4,353,059 to Vaitkus discloses a multi-threshold A/D converter having primary and secondary quantizing stages. The threshold reference voltages for the secondary quantizing stages are obtained by amplifying a threshold reference voltage step derived from the primary quantizing stage. Since the secondary threshold reference voltages are derived directly from the primary reference voltages the secondary reference voltages will track deviations occurring within the primary quantizing stage. A reference tracking amplifier is utilized to amplify a portion of the primary reference voltage and apply same to the secondary stage. By using monolithic integrated circuit fabrication techniques to identically match the reference tracking amplifier with the error amplifiers of the primary quantizing stages, the secondary threshold reference voltages will also track deviations in the peak error signals conveyed from the primary to the secondary quantizing stages.

U.S. Pat. No. 5,182,560 to Shiwaku discloses a high speed, low power parallel analog-to-digital converter (100) with comparator (Cj) having sense amplifiers operating with low power, high speed and a ROM encoder (130) also operating in a low power, high speed regime.

U.S. Pat. No. 5,296,858 to Moyal discloses an apparatus for generating a digital signal representing an analog signal comprising a reference array establishing reference values at hierarchically arranged reference nodes in response to a reference signal. The apparatus includes a first iteration comparing circuit comparing selected first reference values present at first nodes with the analog signal. The first reference values establish a plurality of ranges of reference values. The first comparing circuit generates a first output signal indicating a particular range in which the analog signal first compares with respect to a reference value in a predetermined relation. A logic circuit generates a control signal in response to the first output signal. A second comparing circuit effects second comparing of selected second reference values with the analog signal. The second reference values are present at selected nodes which are in the intervals adjacent the first reference nodes and hierarchically segment those intervals. The second comparing circuit responds to the control signal to effect the second comparing and comprises a plurality of second comparators. Each second comparator receives the analog signal as a first input and receives hierarchically equal of the second reference values from the intervals as a plurality of available second inputs. One of the available second inputs is selected as the second input value to each second comparator in response to the control signal. The second comparing circuit generates a second output and the logic means responds to the first output and the second output to generate the digital signal output.

U.S. Pat. No. 5,450,085 to Stewart et al. discloses an analog to digital conversion of signals at rates higher than can be accomplished by a monolithic flash analog to digital converter is achieved using multiple flash analog to digital converters operated in a parallel architecture. Sample timing of the multiple converters is skewed by selecting subfrequencies of a control clock or different phases of a control clock as the source for the sample control signal. The multiple flash converter outputs are then digitally recombined to produce after operating at single output identical to a flash converter operating at a higher speed than could be obtained for a given set of circuit parameters.

U.S. Pat. No. 5,491,435 to Mun et al. discloses a data sensing circuit for a semiconductor memory device having complementary bit lines, including a PMOS sense amplifier connected between the complementary bit lines, an NMOS sense amplifier connected between the complementary bit lines, a bit line equalization and precharge circuit connected between sensing control nodes of the PMOS and NMOS sense amplifiers, a plurality of first capacitors, a plurality of second capacitors, a plurality of first fuses connected between the sensing control node of the PMOS sense amplifier and respective ones of the first capacitors, a plurality of second fuses connected between the sensing control node of the NMOS sense amplifier and respective once of the second capacitors. Selected ones of the first and/or second fuses can be selectively blown thereby couple selected ones of the first and/or second cap capacitors to the sensing control nodes of the of PMOS and NMOS sense amplifiers, respectively, to thereby equalize the capacitances of the sensing control nodes even when they have different parasitic capacitances.

U.S. Pat. 5,751,170 to Pytheon discloses a circuit for a low voltage sense amplifier obtains a faster time in designing a circuit because a conventional sense amplifier adopting voltage 3.33V can be applied to a semi-conductor memory device requiring a potential of less than 1.0V, and prevents current leakage at a low threshold voltage by providing source voltage to a sense amplifier of a selected memory cell array in an active mode as well as in a standby mode.

Therefore, it is an object of the present invention to provide an improved analog to digital converter that overcomes the deficiencies of the analog to digital converters of the prior art and provides a significant advancement to the electrical conversion art.

Another object of this invention is to provide an improved analog to digital converter that operates without the use of DC circuits for reducing operating power.

Another object of this invention is to provide an improved analog to digital converter that operates on a very low power level in the order of 50 $\mu$W/M Hz-bit.

Another object of this invention is to provide an improved analog to digital converter incorporating an eight bit two stage pipeline flash converter instead of serial or parallel processing.

Another object of this invention is to provide an improved analog to digital converter that is capable of operating up to 100 Mhz.

Another object of this invention is to provide an improved analog to digital converter capable of extendability in excess of ten bits of resolution.

Another object of this invention is to provide an improved analog to digital converter that is a semiconductor process scalable from 0.5 $\mu$M to 0.1 $\mu$M.

Another object of this invention is to provide an improved analog to digital converter incorporating an automatic calibration for compensating for variations incurred during the manufacturing processes.

Another object of this invention is to provide an improved analog to digital converter incorporating a test and calibration for compensating for variations incurred during operation of the improved making analog to digital converter.

Another object of this invention is to provide an improved analog to digital converter that is compatible for incorporating within large-scale integrated circuits.

The foregoing has outlined some of the more pertinent objects of the present invention. These objects should be construed as being merely illustrative of some of the more prominent features and applications of the invention. Many other beneficial results can be obtained by applying the disclosed invention in a different manner or modifying the invention with in the scope of the invention. Accordingly, other objects in a full understanding of the invention may be had by referring to the summary of the invention and the detailed description describing the preferred embodiment of the invention.

SUMMARY OF THE INVENTION

The present invention is defined by the appended claims with specific embodiments being shown in the attached drawings. For the purpose of summarizing the invention, the invention relates to an improved analog to digital converter for converting an analog signal into a digital signal comprising an input circuit and a reference circuit for generating a series of reference signals. A first converter is connected to the input circuit and the reference circuit for comparing the input signal to the reference signals for determining the most significant digital value of the input signal. A second converter is connected to the input circuit and the reference circuit and the first converter for comparing the input signal to the reference signals for determining the least significant digital value of the input signal.

In a more specific example of the invention, the input circuit includes a sample and hold circuit for storing the input signal. Preferably, the input circuit includes a sample and hold circuit for storing the input signal during the period the first converter is determining the most significant digital value of the input signal. The sample and hold circuit stores the input signal during the period the second converter is determining the least significant digital values of the input signal.

In another example of the invention, the reference circuit includes a voltage divider for generating a series of reference signals. The first converter comprises a flash converter for determining the most significant digital values of the input signal using the full range of reference signal. The second converter comprises a flash converter for determining the least significant digital values of the input signal using a selected range of the input signal. The first converter determines only the most significant digital values of the input signal. The second converter determines only the least significant digital values of the input signal. The first converter determines only the most significant digital value of the input signal. The second converter determines only the least significant digital value for the most significant digital value determined by the first converter. A multiplicity of the least significant digital values being equal to one of the most significant digital values.

The invention relates to an improved comparator circuit for comparing an input signal with a reference signal comprising a first comparator stage connected to the input signal and the reference signal for providing a first amplification at a lower gain and at an initial slower rate of comparison. A second comparator stage provides a second amplification at a higher gain and at a higher rate of comparison. A latch circuit receives an output of the second comparator stage for holding an out representative of the comparison of the input signal with a reference signal.

The invention relates to an improved compensation circuit for improving the accuracy of an operating circuit comprising an array of capacitors for generating a variable binary internal signal to provide a wide range of compensation for the operating circuit. An array of switches interconnect the array of capacitors to an array of memories. The array of switches interconnect selective capacitors of the array of capacitors to selected memories of the array of memories for improving the accuracy of an operating circuit.

The foregoing has outlined rather broadly the more pertinent and important features of the present invention in order that the detailed description that follows may be better understood so that the present contribution to the art can be more fully appreciated. Additional features of the invention will be described hereinafter which form the subject of the claims of the invention. It should be appreciated by those skilled in the art that the conception and the specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a fuller understanding of the nature and objects of the invention, reference should be made to the following detailed description taken in connection with the accompanying drawings in which.

Similar reference characteristics refer to similar parts throughout the several Figures of the drawings.

DETAILED DISCUSSION

Figure 1:
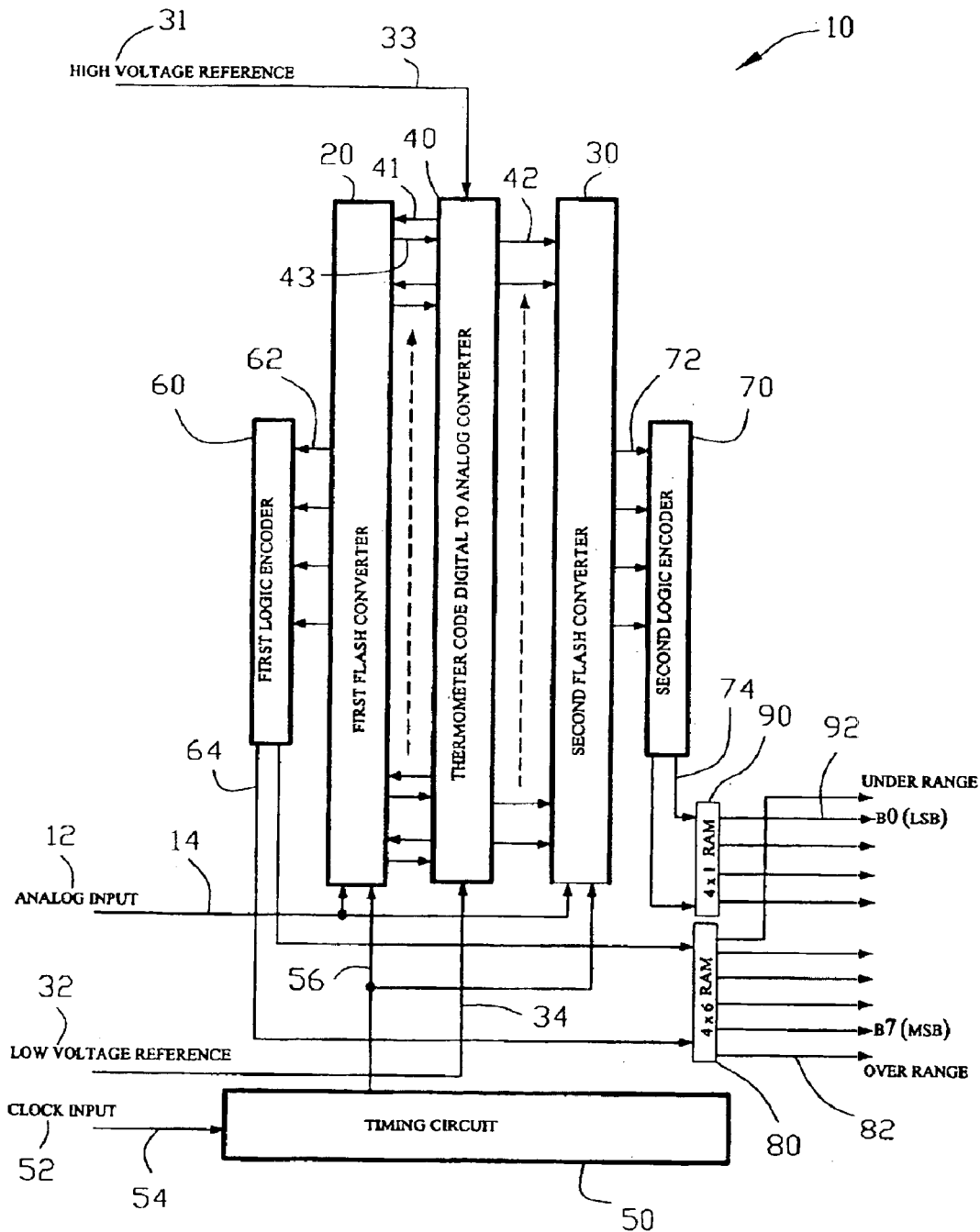
FIG. 1 is a block diagram of the analog to digital converter incorporating the present invention.

FIG. 1 is a block diagram of an analog to digital circuit 10 incorporating the present invention. The analog to digital circuit 10 comprises an analog input 12 connected by a line 14 to a first flash converter 20 and a second flash converter 30. A high voltage reference 31 and a low voltage reference 32 are applied on lines 33 and 34 to a thermometer code digital to analog converter 40. The first flash converter 20 and the second flash converter 30 interact with the thermometer code digital analog converter 40 through connections generally as 41–43. As will be explained in greater detail hereinafter, the first and second flash compare circuits 20 and 30 cooperate with the thermometer code digital analog converter circuit 40 to analyze the input signal 12 with respect to the high voltage and low voltage references 31 and 32 to produce a digital binary code output.

A timing circuit 50 receives an input signal 52 from a clock on line 54 and provides a reset signal on line 56 to the first and second flash converter circuits 20 and 30. The first and second flash converter circuits 20 and 30 are connected to a first and a second logic encoder 60 and 70 through lines 62 and 72. The first logic encoder 60 is connected by output lines 64 to a 4×6 random access memory (RAM) 80. The second logic encoder 70 is connected by output lines 74 to a 4×1 random access memory (RAM) 90. The outputs on lines 82 and 92 represent the final output of the analog to digital converter 10 from information received from the analog input 12.

Figure 2:
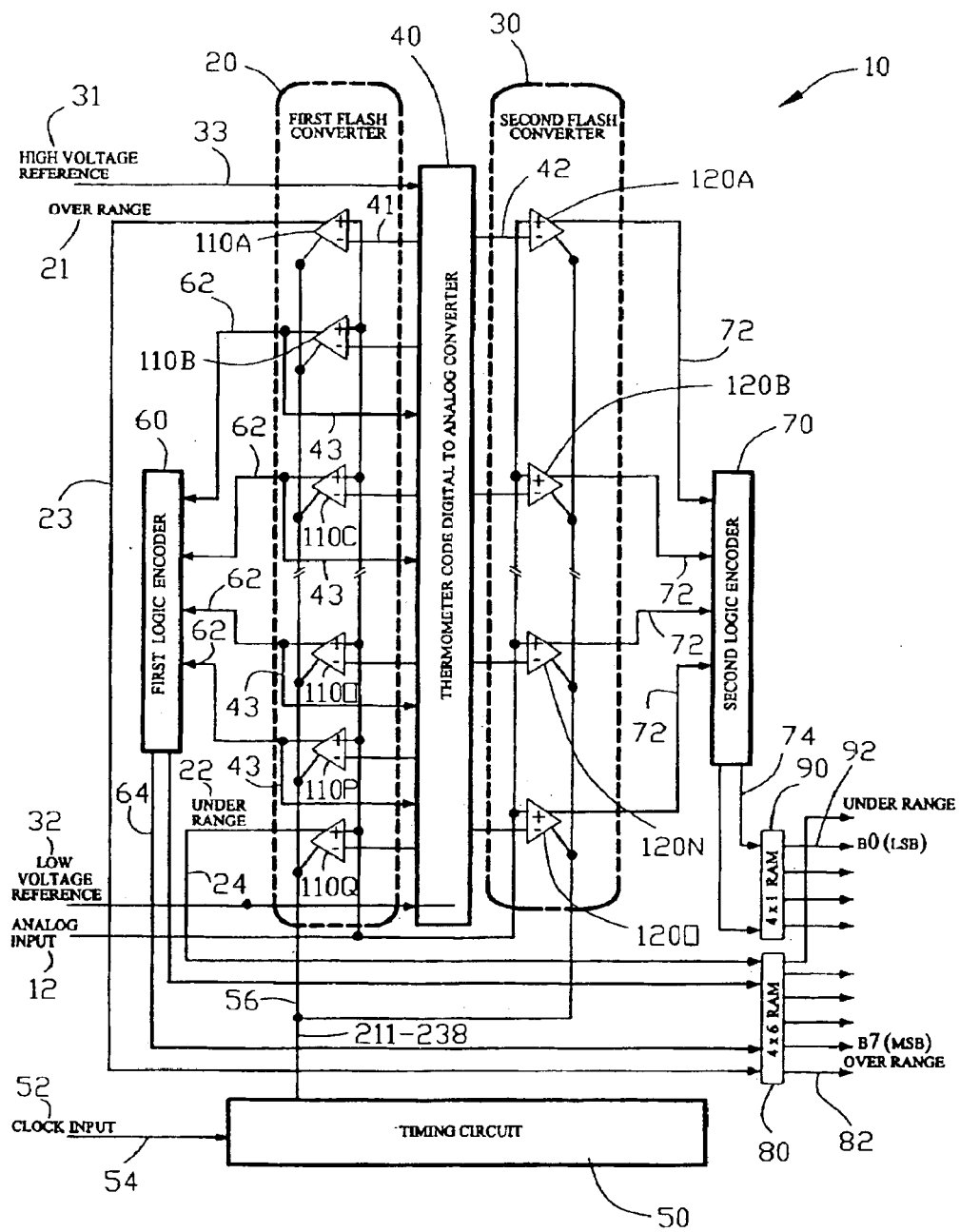
FIG. 2 is a diagram similar to FIG. 1 illustrating the structure of the flash converter blocks of FIG. 1.

FIG. 2 is a diagram similar to FIG. 1 illustrating the content of the first and second flash converter circuits 20 and 30. The first flash converter circuit 20 comprises a plurality of comparators 110. The second flash converter circuit 30 comprises a plurality of comparators 120. For the sake of clarity, only six comparators 110 and four comparators 120 have been shown in FIG. 2. However, for eight-bit resolution, 17 comparators 110 will be located within the first flash converter circuit 20 and 15 comparators 120 will be located within the second flash converter circuit 30. It should be noted that the two additional comparartors 110 (17 verses 15) within the first flash converter are used to produce the over-range signal 21 and the under-range signal 24.

The high voltage reference 31 is applied to the thermometer code digital to analog converter 40. In a similar manner, the low voltage reference 32 is applied to the thermometer code digital to analog converter 40. As will be described in greater detail hereinafter with reference to FIGS. 3 and 5, the high voltage reference 31 and the low voltage reference 32 is applied to the thermometer code digital to analog converter 40.

The first outputs of the thermometer code digital to analog converter 40 are applied on lines 41 to the non-inverting inputs of the comparators 110 within the first flash converter 20. The second outputs of the thermometer code digital analog converter 40 are applied on lines 42 to the non-inverting inputs of the comparators 120 within the second flash converter 30.

The analog input 12 is applied to the non-inverting inputs of each of the comparators 110 and 120. The top comparator 110A produces an over range signal 21 on line 23 to the 4×6 RAM 80. The bottom comparator 110A produces an under range signal 22 on line 24 to the 4×6 RAM 80. The remainder of the comparators 110 provide signals on lines 62 to the first logic encoder 60.

The clock input 52 applied on line 54 to the timing circuit 50 results in enabling pulses to be applied on the lines 56 and 211 through 238 to enable inputs on the first comparators 110 and the second comparators 120. The enable inputs of comparators 110 and 120 actuate the comparators 110 and 120. Upon actuation of the comparators 110, the comparators 110 compare the value of the input signal 12 to the signals applied by line 46 to the inputs to produce output signals on the lines 62 to the first logic encoder 60.

Upon actuation of the comparators 120, the comparators 120 compare the value of input signal 12 to the signal applied by line 42 to the inputs of the comparator 120 to produce an output on the lines 72 to the second logic encoder 70. The lines 64 and 74 are applied to the 4×6 RAM 80 and the 4×1 RAM 90 as show in FIG. 2.

Figure 3:
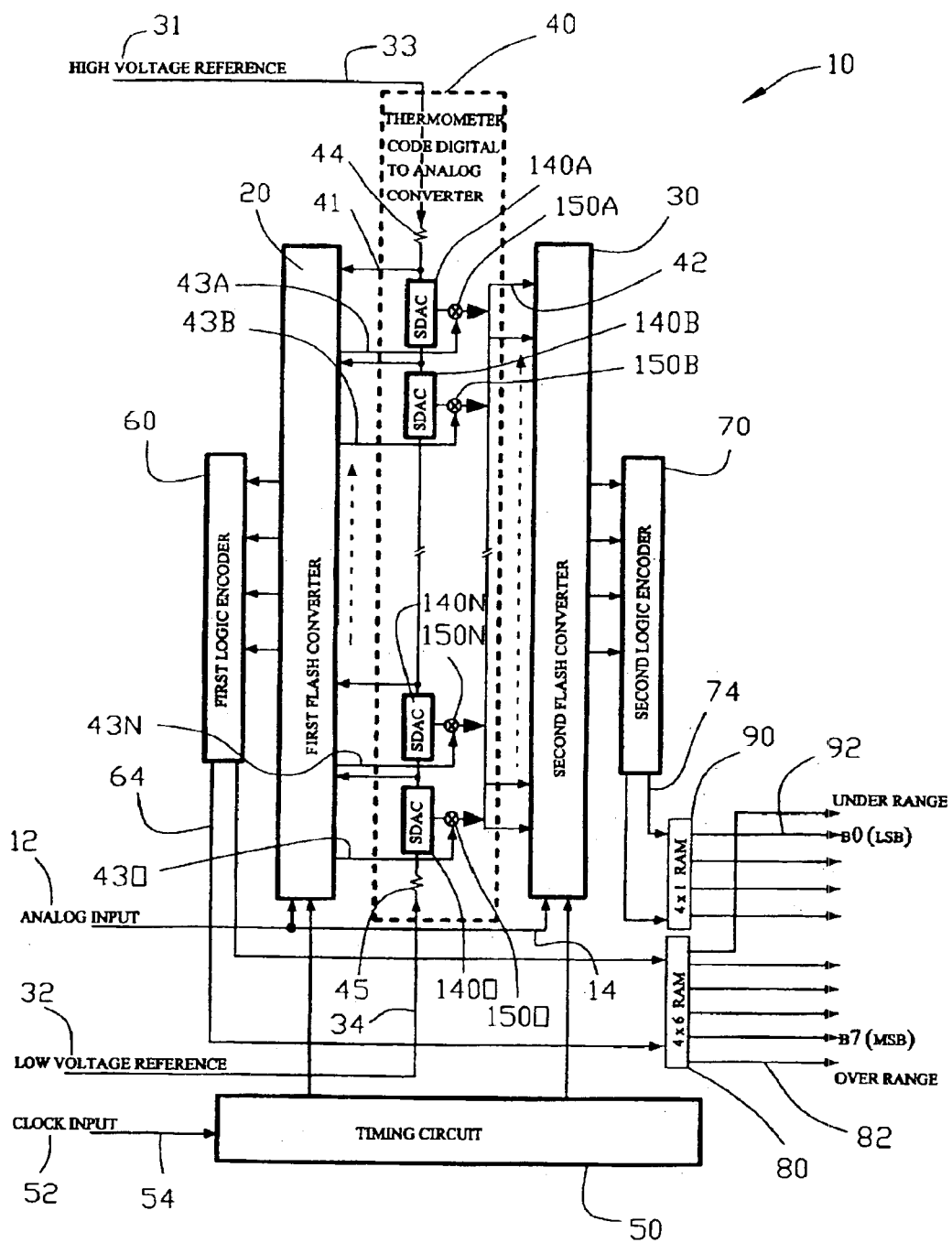
FIG. 3 is an expanded view of the thermometer code digital to analog converter block structure of FIGS. 1 and 2.

FIG. 3 is a more detailed view of the thermometer code digital to analog converter 40 shown in FIGS. 1 and 2. In this diagram, the thermometer code digital to analog converter 40 is more fully shown as comprising a multiplicity of subsidiary digital to analog converters (SDAC) 140, two out of range resistors 44 and 45 and a multiplicity of analog switch sets 150. For the sake of clarity, only four subsidiary digital to analog converters 140 and four analog switch sets 150 have been shown in FIG. 3. However, for eight-bit resolution, 16 subsidiary digital to analog converters 140 and 16 analog switch sets 150 will be located within the thermometer code digital to analog converter 40. Subsidiary digital to analog converters 140 and analog switch sets 150 are described in further detail in FIG. 5.

The thermometer code digital to analog converter 40 comprises a series of multiplicity of subsidiary digital to analog converters 140. Resistors 44 and 45 and the series of subsidiary digital to analog converters 140 are serially arranged between the high voltage reference 31 and the low voltage reference 32 to form the voltage divider network previously referred to with reference to FIG. 2. The subsidiary digital to analog converters 140 provide a series of discrete reference voltages on lines 41 to the inverting inputs of the comparators 110 shown in FIG. 2.

The analog switch sets 150 receive inputs on lines 43A from the first flash converter 20. The inputs on lines 43 actuate a single analog switch set 150 per analog to digital conversion cycle. A set of voltages from a single subsidiary digital to analog converter 140 pass through a single analog switch set 150 to lines 42. Lines 42 provide inputs to the second flash converter 30.

For example, if analog switch set 150A is activated by line 43A from the first flash converter 20, the voltages from subsidiary digital to analog converter 140A are presented on lines 42 to the inputs of all 15 comparators 120 of second flash converter 30.

Figure 4:
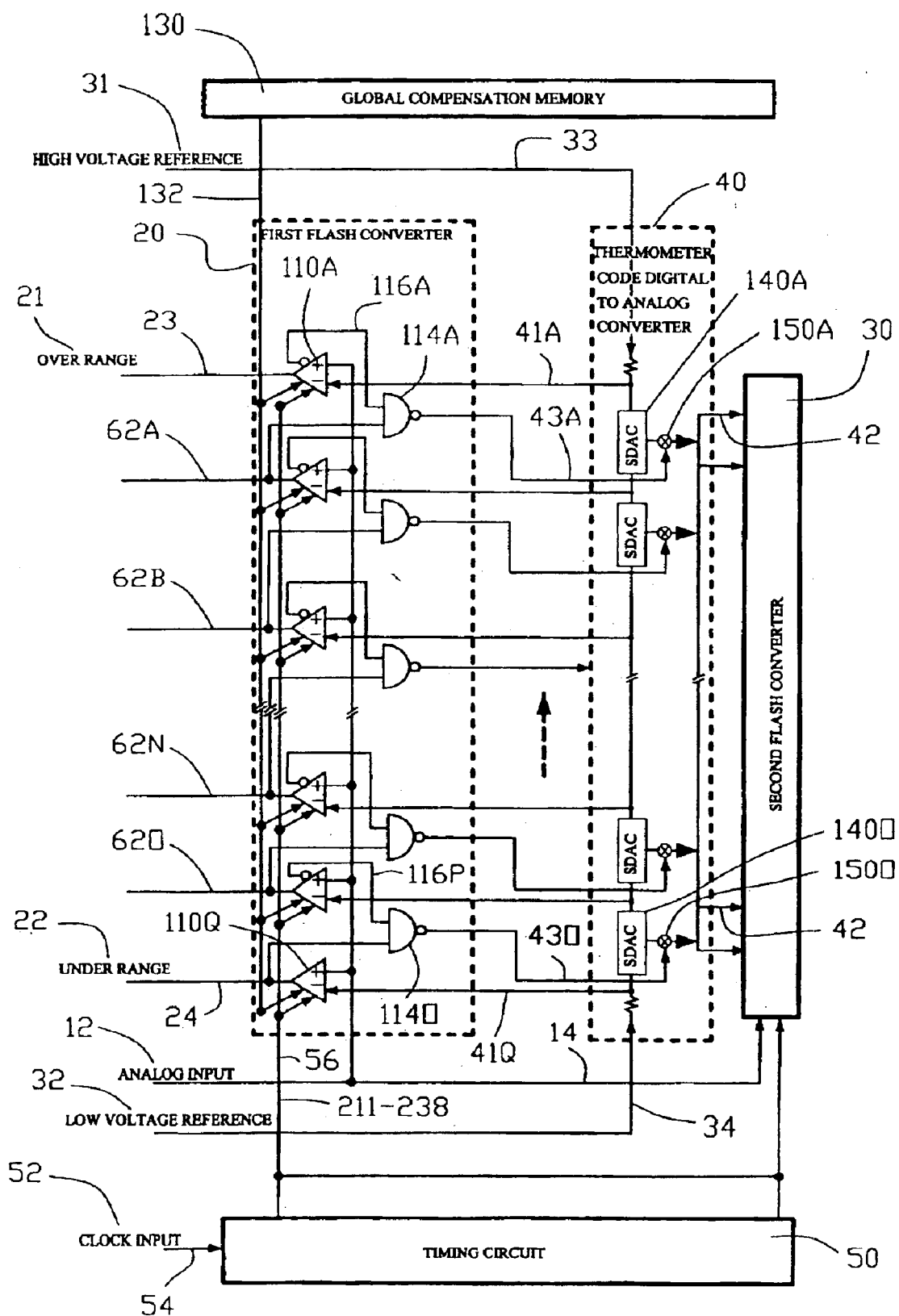
FIG. 4 is a more detailed view of the interconnection between the first flash converter circuits and the thermometer code digital to analog converter circuits.

FIG. 4 is a more detailed view of both the first flash converter 20 and the thermometer code digital to analog converter 40 shown in FIGS. 1, 2 and 3. In this diagram, the first flash converter 20 is more fully shown as comprising a multiplicity of first comparators 110A–110Q and NAND logic gates 114A–114O. For the sake of clarity, only four subsidiary digital to analog converters 140, four analog switch sets 150, six first comparators 110 and five logic gates 114 have been shown in FIG. 4. However, for eight-bit resolution, 16 subsidiary digital to analog converters 140, 16 analog switch sets 150 will be located within the thermometer code digital to analog converter 40 and 17 first comparators 110 and 15 logic gates 114 will be located within the first flash converter 20.

The comparators 110 are activated by signals on lines 56 and lines 211–238 from the timing circuit 50. The comparators 110 are adjusted by signals on lines 132 from a global compensation memory 130. More details will be discussed in FIG. 6 on the operation of the signals on lines 132.

The comparators 110 receive a series of voltages as inputs on lines 41 from the subsidiary digital to analog converter 40 and inputs as a single voltage analog input signal 12 on line 14. Upon activation by signals from the timing circuit 50 on lines 56 and 211–238, the comparators 110 compare signals from lines 14 and 41A–41Q. Results of the comparison are output from the comparators 110 onto lines 23, 24, 62A–62O and 116A–116P. Lines 23 and 24 are single lines. Lines 62 comprise a set of 15 lines. Each comparator 110 produces non-inverting/inverting logic output signals on lines 23 and 116A, and lines 62 and 116B–116P.

Lines 116 and 24 provide input signals to NAND logic gates 114. NAND logic gates 114 produce signals on lines 43 that enter the thermometer code digital to analog converter 40 and activate one of the analog switch sets 150. The selected analog switch set 150 presents the selected subsidiary digital to analog converter 140 voltage signals to the second flash converter 30 over lines 42.

A single selected subsidiary digital to analog converter 140 produces a set of sixteen voltage signals comprising in total, one-sixteenth of the voltage present across the high voltage reference signal 31 and present across the low voltage reference signal 32. Each of the sixteen voltages produced by a single subsidiary analog to digital converter 140 enabled by a single analog switch set 150 is one two-hundred and fifty-sixth of the voltage present across the high voltage reference signal 31 and present across the low voltage reference signal 32.

Figure 5:
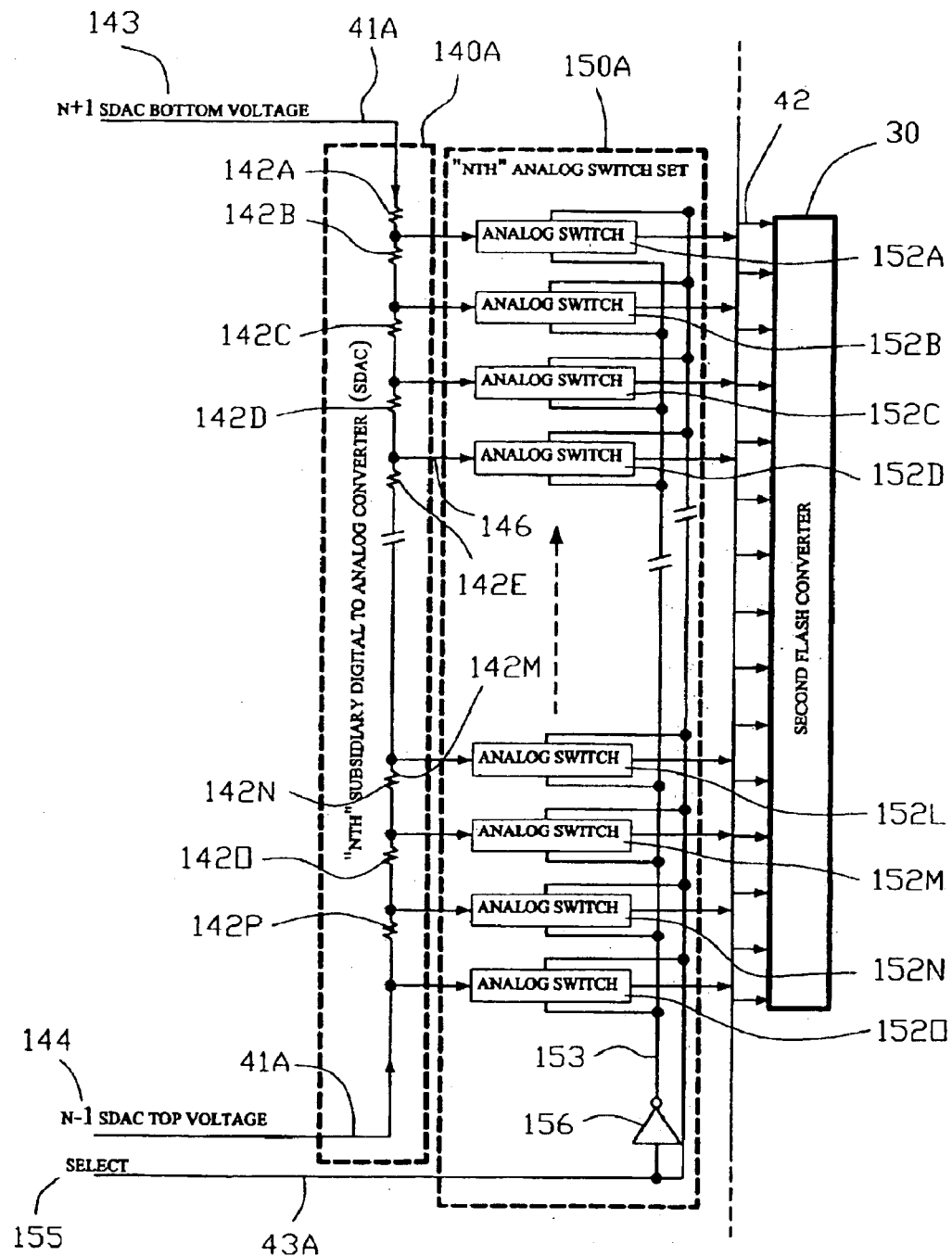
FIG. 5 is a magnified view of one of the plurality of subsidiary thermometer code digital to analog converter (SDAC) circuits and the analog switch sets of FIG. 3.

FIG. 5 is a more detailed view of a single subsidiary digital to analog converter 140 and a single analog switch set 150. In a diagram, a subsidiary digital to analog converter 140 is more fully shown as comprising a stack of resistors 142. For the sake of clarity, only eight of the 16 resistors needed for 8-bit resolution are shown. Also in this diagram, a single analog switch set 150 is more fully shown as comprising a stack of analog switches 152 and a single logic gate inverter 156. For the sake of clarity, only eight of the 16 analog switches needed for 8-bit resolution are shown.

For example, the Nth subsidiary digital to analog converter 140 receives the N+1th digital to analog converter 140 bottom voltage 143 on line 141 and the N−1th digital to analog converter 140 top voltage 144 on another line 41. The difference between these voltages is divided through a series of resistors 142A–142P into a set of voltages that is presented to the "Nth" analog switch set 150 through lines 146.

The analog switch set 150 receives select input signal 155 on lines 43 as also shown in FIG. 4. This select input signal 156 is applied to the non-inverting enables of the analog switches 152 and is inverted by the NOT logic gate 155 and applied to the inverting enables of the analog switches 152 on line 153. Upon enabling in this fashion, the analog switches 152 pass the divided voltages from the subsidiary digital to analog converter 140 on lines 42 to the second flash converter 30. It should be noted that lines 42 are arranged in a bus structure that receives inputs from all 16 subsidiary digital to analog converters 140 as illustrated in FIG. 4.

Figure 6:
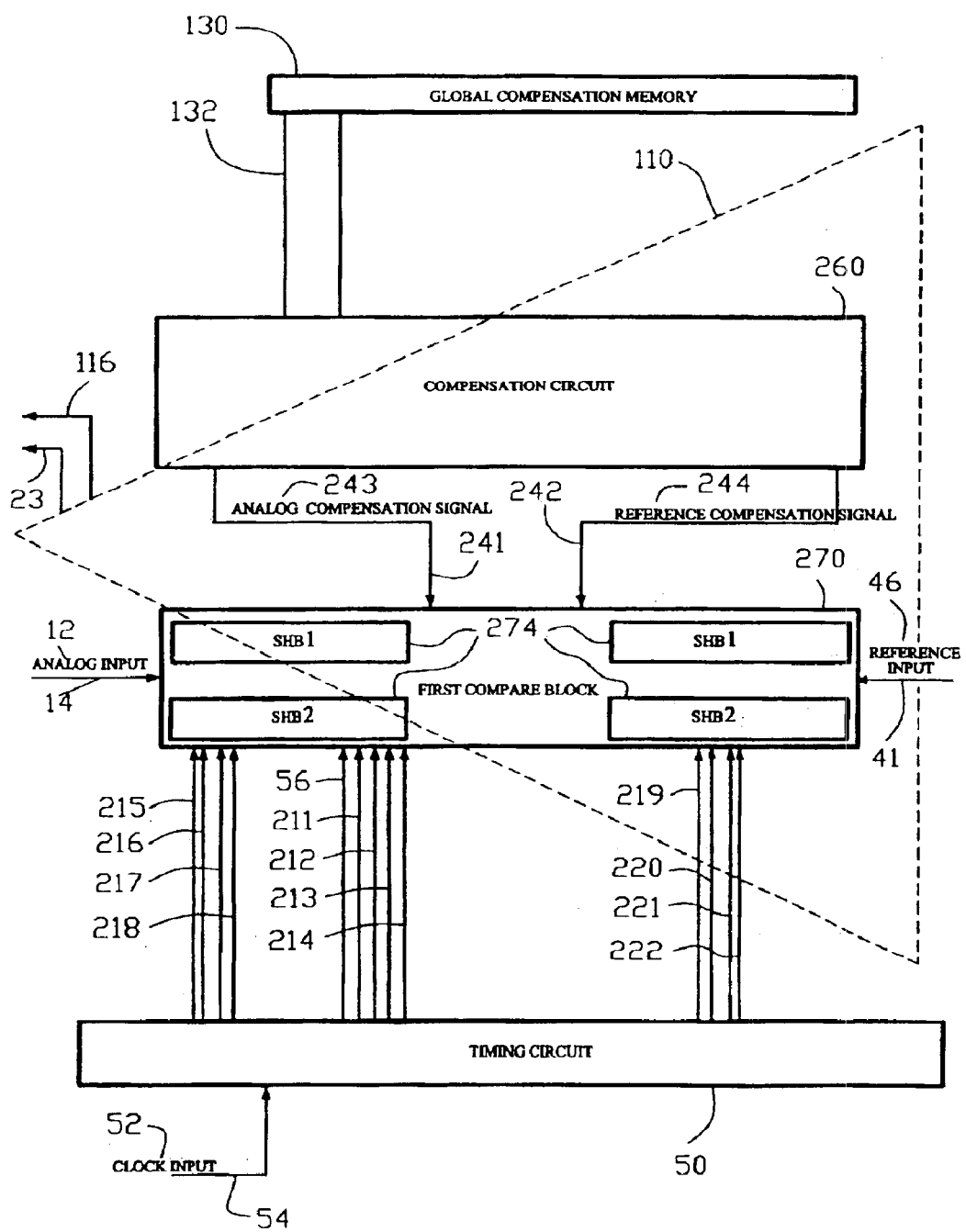
FIG. 6 is a magnified view of one of the plurality of comparators of the first flash compare circuits of FIG. 1.

FIG. 6 is a more detailed view of a single comparator 110. In this diagram, a single comparator 110 is more fully shown as comprising a compensation circuit 260 and a first compare block 270. Within the first compare block 270 there are four sample and hold blocks 274 arranged in two columns. The left column samples and holds the analog input signal 12 whereas the right column samples and holds the reference signal 46. The first row of sample and hold blocks 274 are designated sample and hold blocks 1 (SHB1) The second row of sample and hold bocks 274 are designated sample and hold blocks 2 (SHB2) More detail on the arrangement, structure and connection of these sample and hold blocks 274 is found in FIG. 10. The compensation circuit 260 receives inputs from the global compensation memory 130 on lines 132. The compensation circuit 260 produces an analog compensation signal 243 on line 241 and a reference compensation signal 244 on line 242.

The first compare block 270 receives for comparison the analog input 12 on line 14 and the reference input 46 on line 41. The first compare block 270 receives an analog compensation signal 243 on line 241 and a reference compensation signal 244 on line 242 from the compensation circuit 260. The first compare block 270 receives a multitude of timing signals from the timing circuit 50 on lines 211–222 and a reset signal from the timing circuit 50 on line 56. The first compare block 270 produces the results of its comparisons on lines 23 and 116.

Figure 7:
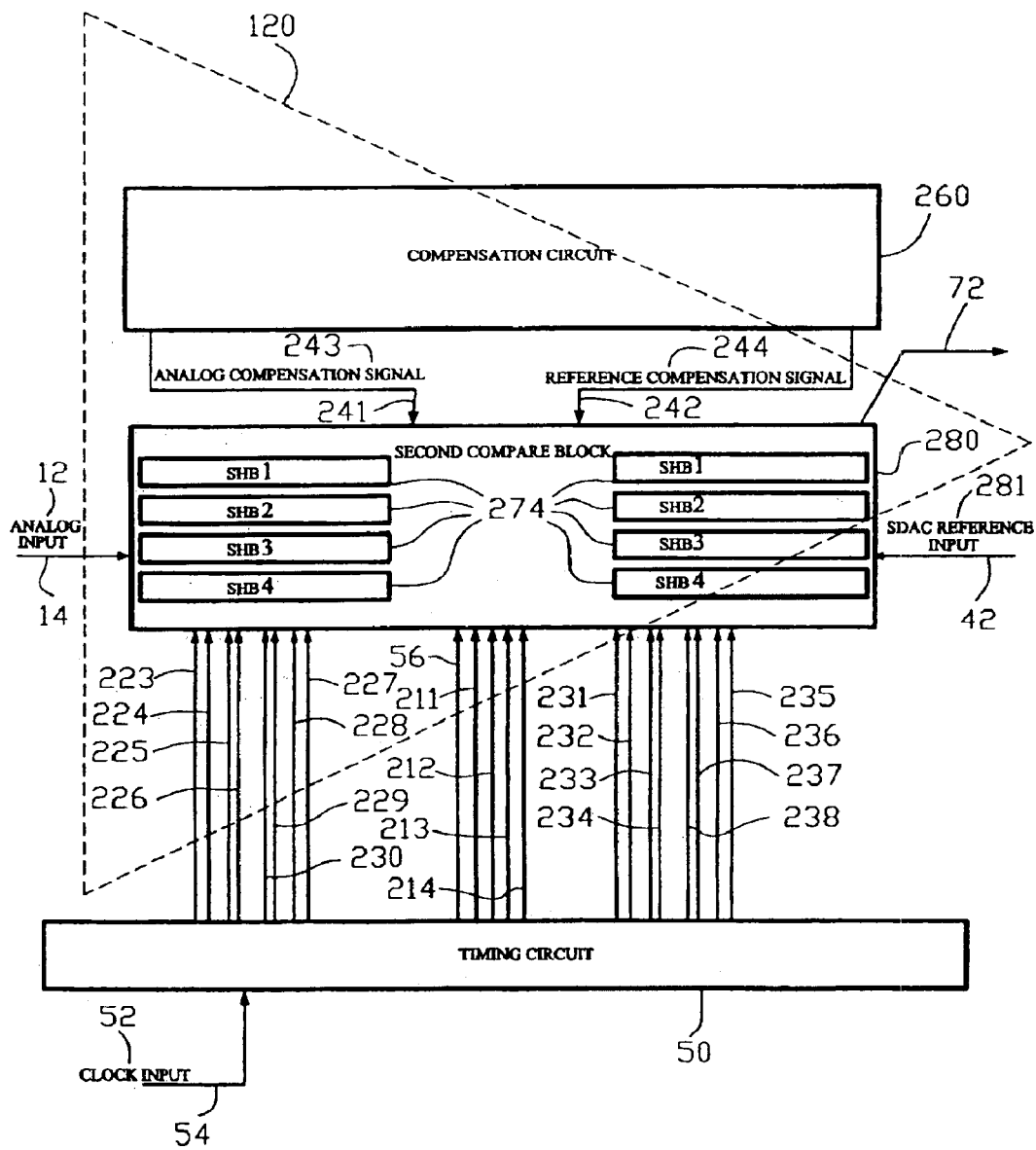
FIG. 7 is a more detailed view of one of the plurality of comparators of the second flash compare circuit of FIG. 1.

FIG. 7 is a more detailed view of a single comparator 120. In this diagram, a single comparator 120 is more fully shown as comprising a compensation circuit 260 and a second compare block 280. Within the second compare block 280 there are eight sample and hold blocks 274 arranged in four rows. The first row of sample and hold blocks 274 are designated sample and hold blocks 1 (SHB1s.) The second row of sample and hold blocks 274 are designated sample and hold blocks 2 (SHB2s.) The third row of sample and hold blocks 274 are designated sample and hold blocks 3 (SHB3) The fourth row of sample and hold blocks 274 are designated sample and hold blocks 4 (SHB4) More detail on the arrangement, structure and connection of these sample and hold blocks 274 is found in FIG. 11.

The second compare block 280 receives for comparison the analog input 12 on line 14 and the SDAC reference input 281 on line 42. The second compare block 280 receives an analog compensation signal 243 on line 241 and a reference compensation signal 244 on line 242 from the reference compensation signal circuit 260. The second compare block 280 receives a multitude of timing signals from the timing circuit 50 on lines 211–214 and 223–228 and a reset signal from the timing circuit 50 on line 56. The second compare block 280 produces an output on line 74.

Figure 8:
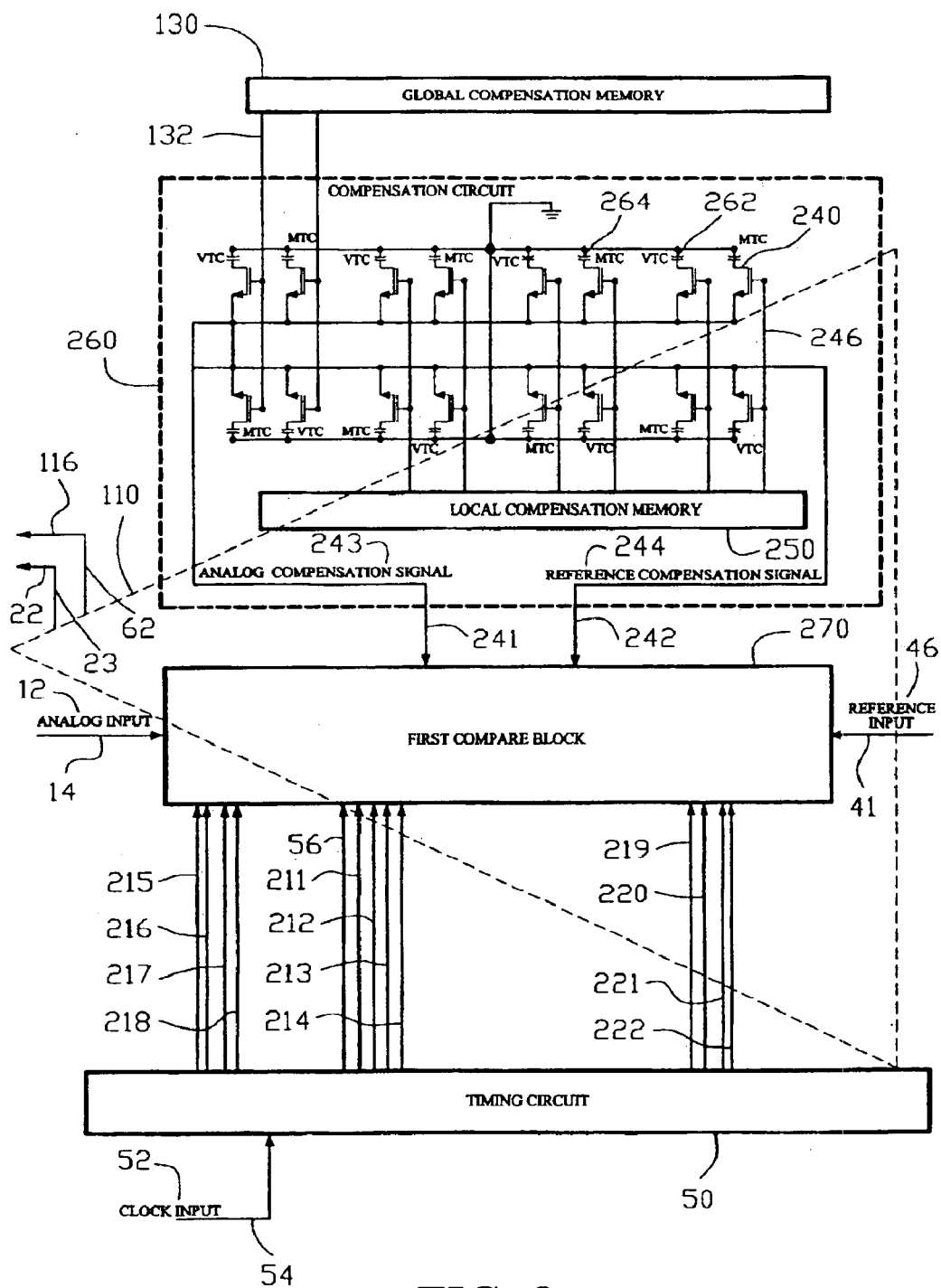
FIG. 8 is a more detailed view of the compensation circuit within one of the first flash compare circuits of FIG. 1.

FIG. 8 is a more detailed view of the compensation circuit 260 within the single comparator 110. In this diagram, the compensation circuit 260 is more fully shown as comprising a collection of transistors 240, variable trim capacitors (VTC) 262 and minimum trim capacitors (MTC) 264. The transistors 240 are arranged in two rows or ladders, each with a corresponding capacitor (variable trim capacitor (VTC) 262 or minimum trim capacitor (MTC) 264 connected to ground. The transistor 240 inputs are connected to lines 132 from the global compensation memory 130 or to lines 246 from the local compensation memory 250.

When the transistors 240 are activated by signals on lines 246 they produce the analog compensation signal 243 presented to the first compare block 270 on line 241 and the reference compensation signal 244 presented to the first compare block 270 on line 242. Both the local compensation memory 250 and the global compensation memory 130 are programmed with digital values for providing the required compensation.

Figure 9:
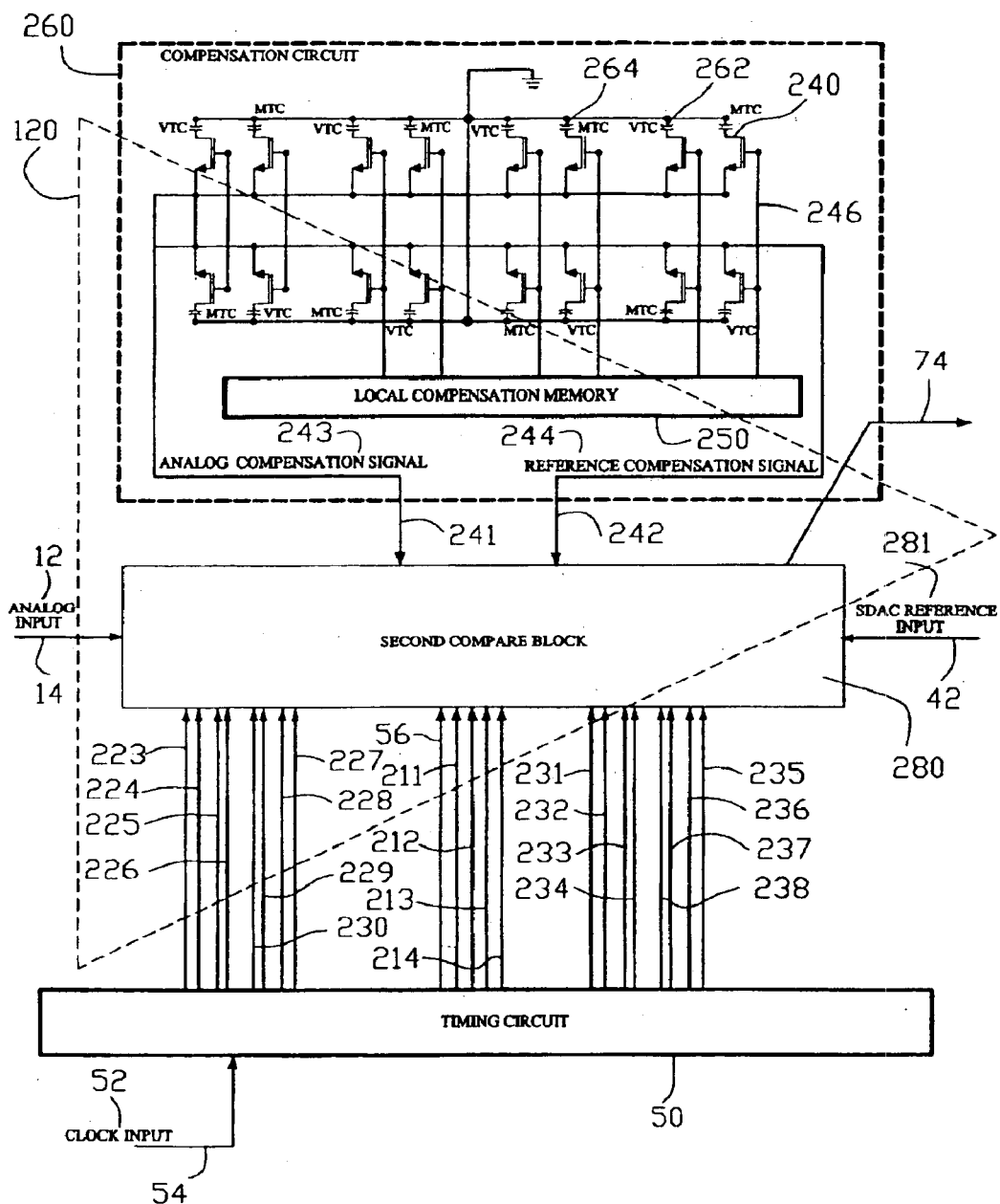
FIG. 9 is a more detailed view of the compensation circuit within one of the second flash compare circuits of FIG. 1.

FIG. 9 is a more detailed view of the compensation circuit 260 within the single comparator 120. In this diagram, the compensation circuit 260 is more fully shown as comprising a collection of transistors 240, variable trim capacitors (VTCs) 262 and minimum trim capacitors (MTCs) 264. The transistors 240 are arranged in two rows or ladders, each with a corresponding capacitor (variable trim capacitor (VTCs) 262 or minimum trim capacitor (MTCs) 264) connected to ground. The transistor 240 inputs are connected to lines 246 from the local compensation memory 250. Note that in the single comparator 120, no global compensation memory inputs are used in the compensation circuit 260 as they are in the single comparator 110. When the transistors 240 are activated by signals on lines 246 they produce the analog compensation signal 243 presented to the second compare block 280 on line 242. The local compensation memory 250 are programmed with digital values for providing the required compensation.

Figure 10:
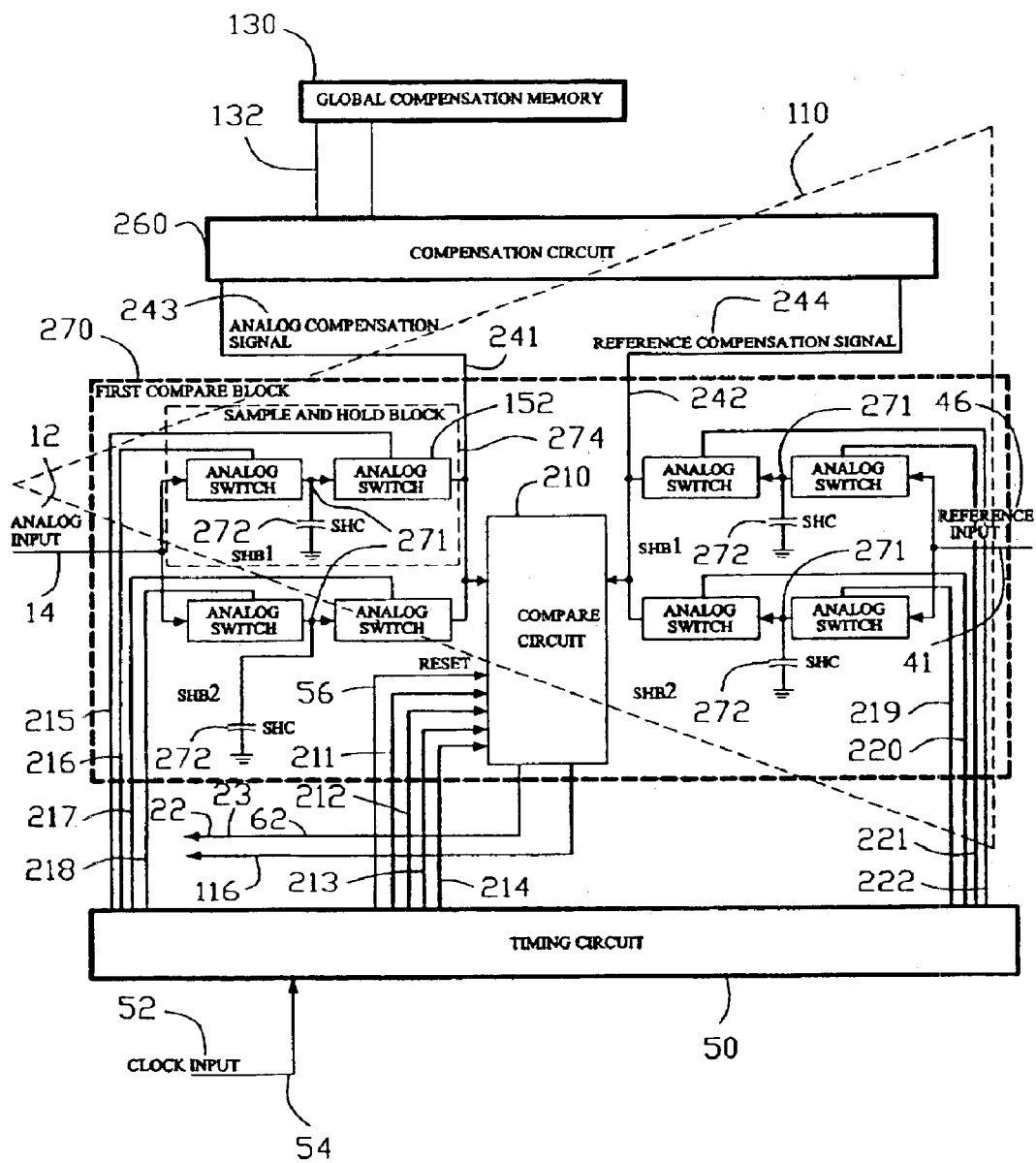
FIG. 10 is a more detailed view of the first compare block and the sample and hold circuits within one of the first flash compare circuits of FIG. 1.

FIG. 10 is a more detailed view of the first compare block 270 within the single comparator 110. In this diagram, the first compare block 270 is more fully shown as comprising eight analog switches 152, four sample and hold capacitors (SHC) 272 and a compare circuit 210.

The analog switches 152 are arranged in pairs with a sample and hold capacitor (SHC) 272 connected on one side by line 271 to each analog switch pair and on the other side to ground. All eight analog switches 152 are individually controlled by lines 215–222 from the timing circuit 50. Each analog switch 152 pair and corresponding sample and hold capacitor (SHC) 272 collectively form a single sample and hold circuit.

Two of the analog switch pairs receive the analog input 12 on line 14. These two analog switch pairs present an output on line 241 to the compare circuit 210. Two of the analog switch pairs receive the reference input 46 on line 41. These two analog switch pairs present an output on line 242 to the compare circuit 210.

To these signals on lines 241 and 242, as discussed in FIG. 8, the compensation circuit 260 adds outputs on lines 241 and 242, an analog compensation signal 243 on line 241 and a reference compensation signal 244 on lines 242. These compensated signals are presented to the compare circuit 210 on lines 241 and 242.

The compare circuit 210 receives control signals on lines 56 and 211–214 from the timing circuit 50. The compare circuit 210 also receives inputs on lines 241 and 242 as discussed above. The compare circuit 210 produces outputs on lines 23 and 116.

Figure 11:
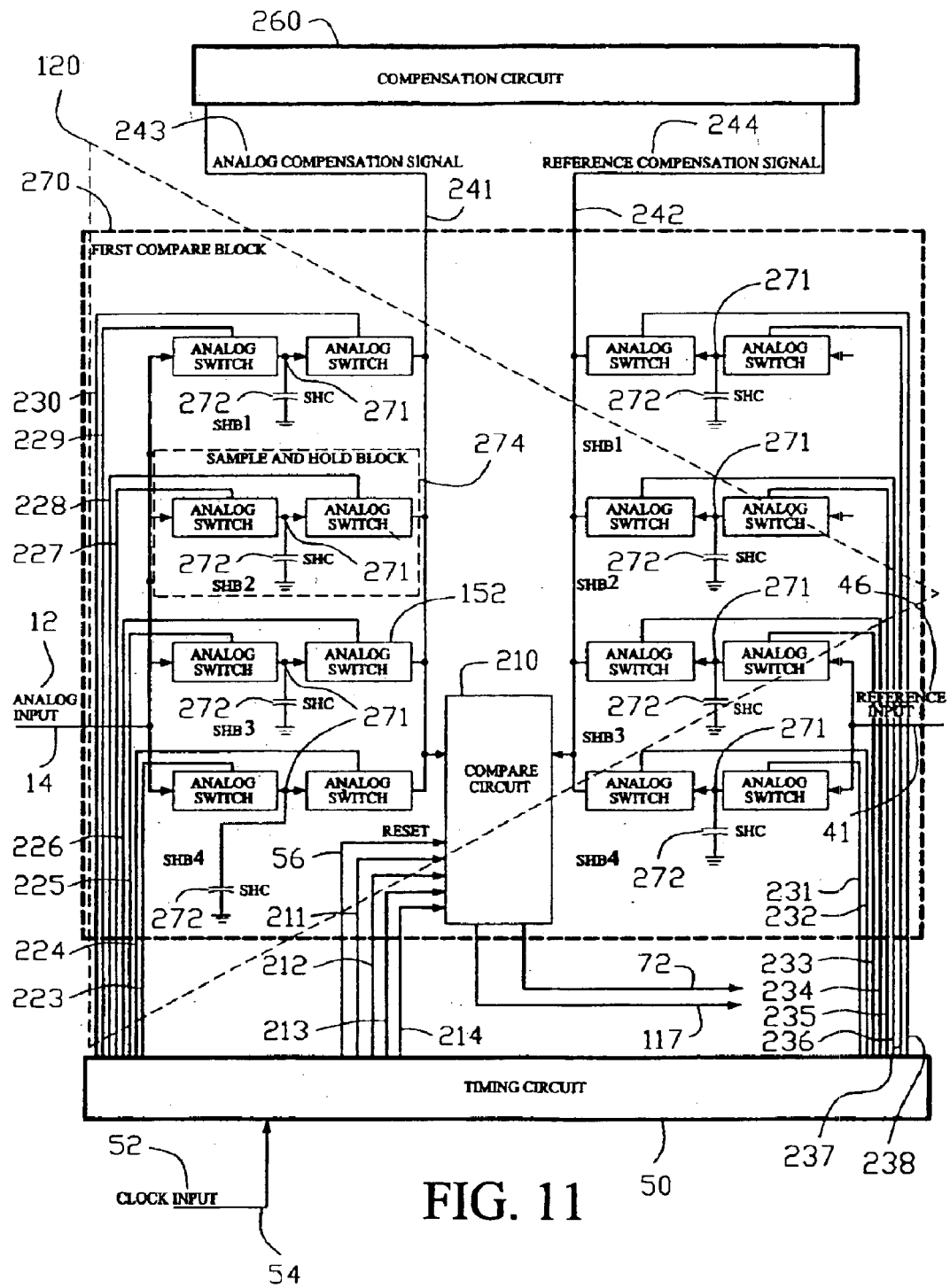
FIG. 11 is a more detailed view of the second compare block and the sample and hold circuits within one of the second flash compare circuits of FIG. 1.

FIG. 11 is a more detailed view of the second compare block 280 within the single comparator 120. In this diagram, the first compare block 280 is more fully shown as comprising sixteen analog switches 154, eight sample and hold capacitors (SHC) 272 and a compare circuit 210.

The analog switches 152 are arranged in pairs with a sample and hold capacitor (SHCs) 272 connected on one side by line 271 to each analog switch pair and on the other side to ground. All sixteen analog switches 152 are individually controlled by lines 223–238 from the timing circuit 50.

Four of the analog switch pairs receive the analog input 12 on line 14. These four analog switch pairs present an output on line 242 to the compare circuit 210.

To these signals on lines 241 and 242, as discussed in FIG. 9, the compensation circuit 260 adds outputs on lines 241 and 242, an analog compensation signal 243 on line 241 and a reference compensation signal 244 on lines 242. These compensation signals are presented to the compare circuit 210 on lines 241 and 242.

The compare circuit 210 receives control signals on lines 56 and 211–214 from the timing circuit 50. The compare circuit 210 also receives inputs on lines 241 and 242 as discussed above. The compare circuit produces outputs on lines 74 and 117.

Figure 12:
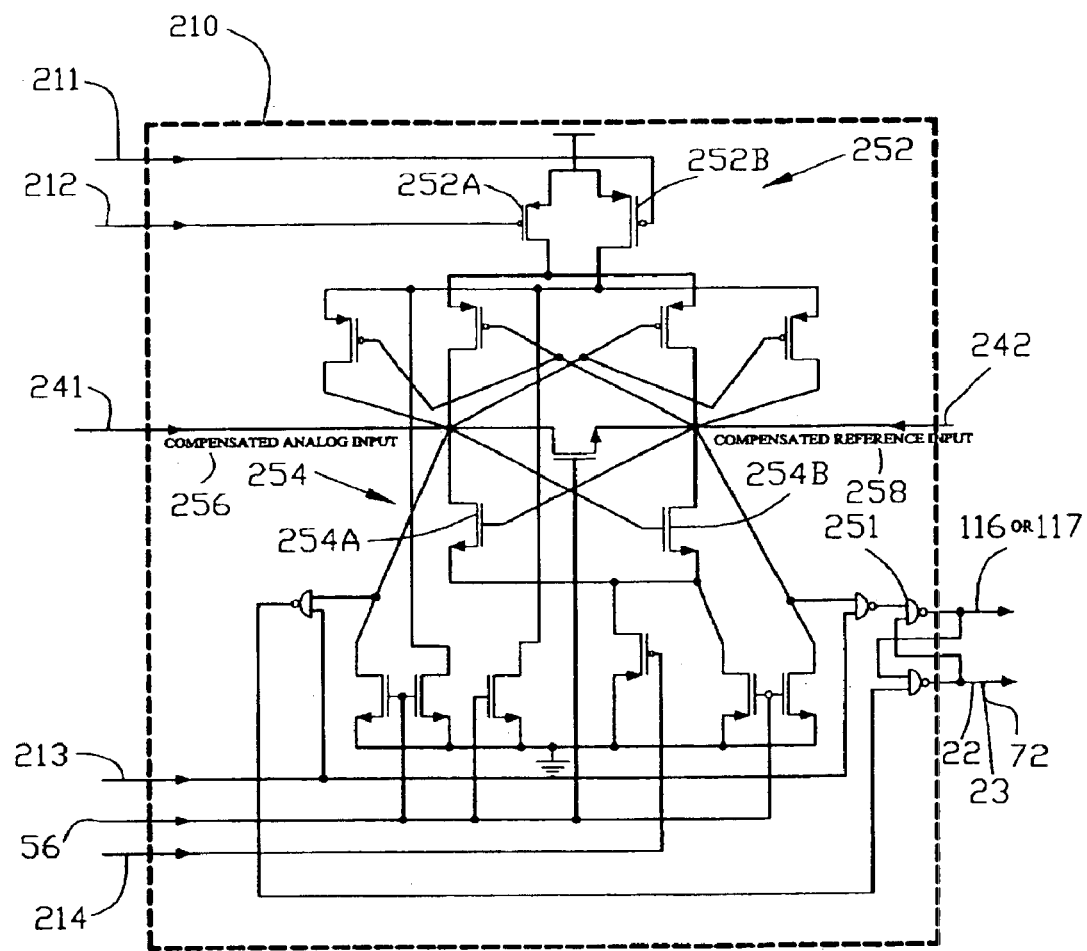
FIG. 12 is a more detailed view of the compare circuit found within all of the flash compare circuits of FIG. 1.

FIG. 12 is a more detailed view of the compare circuit 210 found within both the first compare block and the second compare block 280. In this diagram, the compare circuit 210 is more fully shown as comprising eight PMOS compare transistors 252, seven NMOS compare transistors and four NAND gates 251.

The NMOS compare transistors 254 and the PMOS compare transistors 252 are arranged in a largely symmetric network that amplifies the differences between the compensated analog input 256 entering on line 241 and the compensated reference input 258 entering on line 242. The control signals entering on line 56 and lines 211–214 coordinate the action of the PMOS compare transistors 252, the NMOS compare transistors 254 and the NAND gates 251. The NAND gates 251 are arranged in a latch circuit that receive inputs on lines 241 and 242 and present output signals on lines 116 and 117 and lines 22, 23, 62 or 72.

Figure 13:
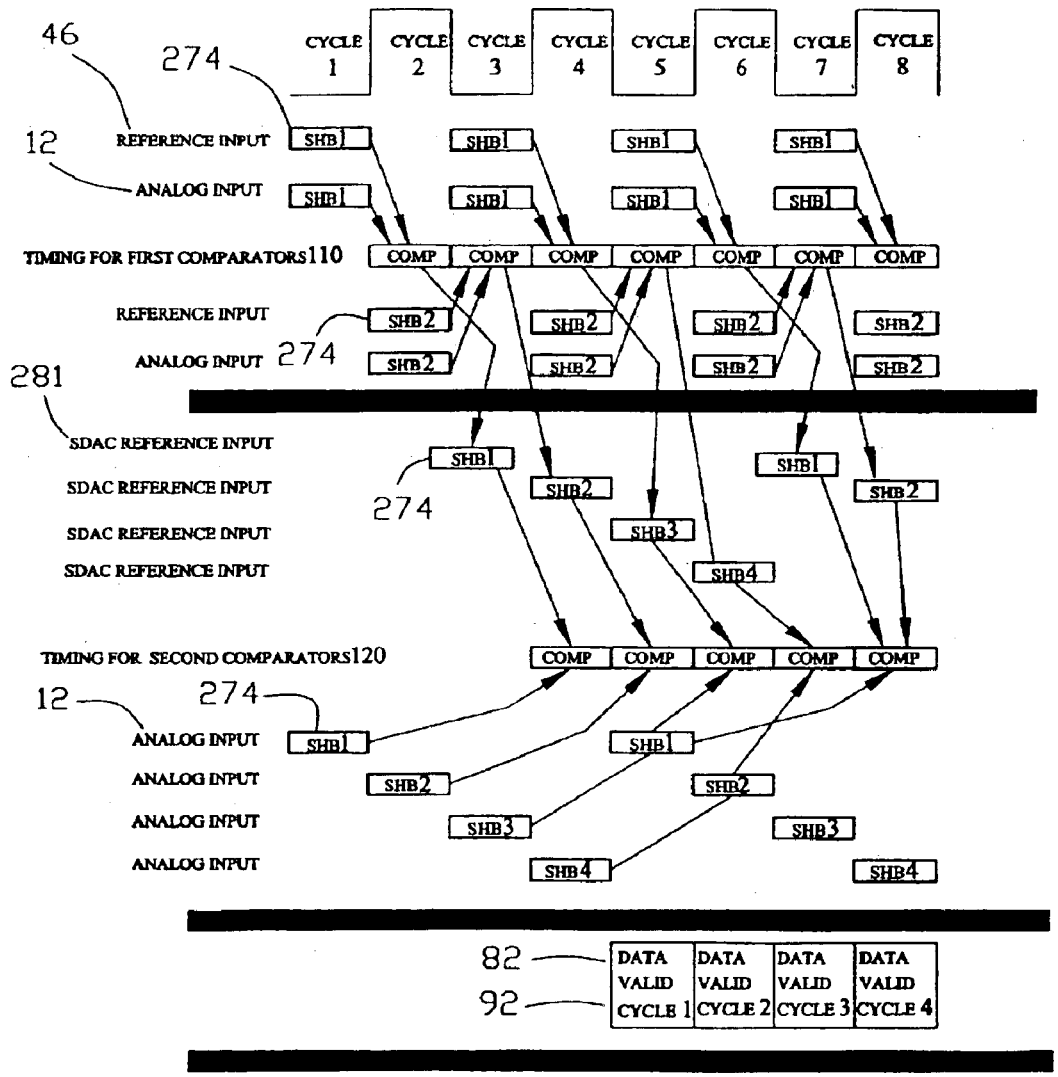
FIG. 13 is a detailed view of the pipeline data flow through the circuits of FIG. 1 during eight clock cycles.

FIG. 13 shows eight clock cycles of the analog to digital converter 10 and the relative movement of data through the first comparators 110 sample and hold blocks (SHB) 274 and compare circuits 210.

The flow of data occurs with the following steps:
Cycle 1:
 a. Timing circuit 50 generates timing signals on lines 216 and 221 to sample the analog input signal 12 on line 14 and the reference input signal 46 on line 41.
 b. Timing circuit 50 generates a timing signal on analog input line 229 to cause the SHB1 sample and hold block 274 within the second comparators 120 to sample the analog input 12 signal as shown in FIGS. 2 and 11. It should be noted that no reference signal is stored until a later time.
Cycle 2:
 a. Timing circuit 50 generates timing signals on analog input lines 215 and reference input line 222 to cause the SHB1 sample and hold blocks 274 to present data to the compare circuit 210 within the first comparators 110 as shown in FIGS. 2 and 10.

b. Timing circuit 50 generates timing signals on lines 56 and 211–214 to cause the compare circuits 210 within the first comparators 110 to produce their outputs on lines 22, 23 or 62 and lines 16 as shown in FIG. 10.

c. Timing circuit 50 generates timing signals on analog input lines 218 and reference output line 219 to cause the SHB2 sample and hold blocks 274 within the first comparators 110 to sample data from reference input 46 and analog input 12 as shown in FIGS. 2 and 10.

d. Timing circuit 50 generates a timing signal on analog input line 227 to cause the SHB2 sample and hold blocks 274 within the second comparators 120 to sample data from the analog input 12 as shown in FIGS. 2 and 11.

Cycle 3:

a. Timing circuit 50 generates timing signals on analog input lines 217 and reference input line 220 to cause the SHB2 sample and hold blocks 274 to present data to compare circuit 210 within the first comparators 110 as shown in FIGS. 2 and 10.

b. Timing circuit 50 generates timing signals on analog input lines 216 and reference input line 221 to cause the SHB1 sample and hold blocks 274 within the first comparators 110 to sample data from reference input 46 and analog input 12 as shown in FIGS. 2 and 10.

c. Timing circuit 50 generates timing signals on lines 56 and 211–214 to cause the compare circuits 210 within the first comparators 110 produce their outputs on lines 22, 23 or 62 and lines 116 using data from the SHB2 set of sample and hold blocks 274 as shown in FIG. 10.

d. The outputs from the first flash converter 20 on lines 43 enable the thermometer code digital to analog converter 40 to produce the SDAC reference inputs 281 applied to the second flash converter 30 on lines 42.

e. Timing circuit 50 generates a timing signal on the reference input line 237 to cause the SHB1 sample and hold block 274 within the second comparators 120 to sample data from SDAC reference input 281 on line 42 as shown in FIGS. 2 and 11.

f. Timing circuit 50 generates a timing signal on line 225 to cause the SHB3 sample and hold blocks 274 within the second comparators 120 to sample data from the analog input 12 as shown in FIGS. 2 and 11.

Cycle 4:

a. Timing circuit 50 generates timing signals on the analog input lines 215 and the reference input line 222 to cause the SHB1 sample and hold blocks 274 to present data to the compare circuit 210 within the first comparators 110 as shown in FIGS. 2 and 10.

b. Timing circuit 50 generates timing signals on lines 56 and 211–214 to cause the compare circuits 210 within the first comparators 110 to produce their outputs on lines 22, 23 or 62 and line 116 as shown in FIG. 10.

c. Timing circuit 50 generates timing signals on analog input line 218 and reference input line 219 to cause the SHB2 sample and hold blocks 274 within the first comparators 110 to sample data from reference input 46 and analog input 12 as shown in FIGS. 2 and 10.

d. Timing circuit 50 generates a timing signal on analog input line 223 to cause the SHB4 sample and hold blocks 274 within the second comparators 120 to sample data from the analog input 12 as shown in FIGS. 2 and 11.

e. The outputs from the first flash converter 20 on lines 43 enable the thermometer code digital to analog converter 40 to produce the SDAC reference inputs 281 applied to the second flash converter 30 on lines 42.

f. Timing circuit 50 generates a timing signal on the SDAC reference input line 235 to cause the SHB2 sample and hold block 274 within the second comparators 120 to sample data from SDAC reference input 281 on line 42 as shown in FIGS. 2 and 11.

g. Timing circuit 50 generates timing signals on lines 56 and lines 211–214 to cause the compare circuits 210 within the second comparators 120 to use the SDAC reference input (SHB1) and the analog input signals (SHB2) to produce outputs on lines 72 and 117 as shown in FIG. 11.

Cycle 5:

a. Timing circuit 50 generates timing signals on analog input lines 216 and reference input lines 212 to cause the SHB1 sample and hold blocks 274 within the first comparators 110 to sample data from reference input 46 and analog input 12 as shown in FIGS. 2 and 10.

b. Timing circuit 50 generates a timing signal on analog input line 229 to cause the SHB3 sample and hold block 274 within the second comparators 120 to sample the analog input 12 signal as shown in FIGS. 2 and 11.

c. Timing circuit 50 generates timing signals on lines 56 and 211–214 to cause the compare circuits 210 within the first comparators 110 to produce their outputs on lines 22, 23 or 62 and line 116 as shown in FIG. 10.

d. Timing circuit 50 generates a timing signal on SDAC reference input line 233 to cause the SHB3 sample and hold block 274 within the second comparators 120 to sample data from SDAC reference input 281 on line 42 as shown in FIGS. 2 and 11.

e. The outputs from the first flash converter 20 on lines 43 enable the thermometer code digital to analog converter 40 to produce the SDAC reference inputs 281 applied to the second flash converter 30 on lines 42.

f. Timing circuit 50 generates timing signals on lines 56 and 211–214 to cause the compare circuits 210 within the second comparators 120 to use the SDAC reference input (SHB2) and the analog input signals (SHB2)to produce outputs on lines 72 and 117 as shown in FIG. 11.

g. The results from the first comparators 110 and the second comparators 120 pass through the 4×6 RAM 80 to outputs on lines 82 and the 4×1 RAM 90 to outputs on 92, producing the digital data representing the signals sampled.

Cycle 6:

a. Timing circuit 50 generates timing signals on the analog input lines 215 and the reference input 222 to cause the SHB1 sample and hold blocks 274 to present data to the compare circuit 210 within the first comparators 110 as shown in FIGS. 2 and 10.

b. Timing circuit 50 generates timing signals on lines 56 and 211–214 to cause the compare circuits 210 within the first comparators 110 produce their outputs on lines 23 and 116 as shown in FIG. 10.

c. Timing circuit 50 generates timing signals on the analog input lines 218 and the reference input 219 to cause the SHB2 sample and hold blocks 274 within the first comparators 110 to sample data from reference input 46 and analog input 12 as shown in FIGS. 2 and 10.

d. Timing circuit 50 generates a timing signal on line 223 to cause the SHB2 sample and hold blocks 274 within the second comparators 120 to sample data from the analog input 12 as shown in FIGS. 2 and 11.

e. The outputs from the first flash converter 20 on lines 43 enable the thermometer code digital to analog converter 40 to produce the SDAC reference inputs 281 carried to the second flash converter 30 on lines 42.

f. Timing circuit 50 generates a timing signal on line 235 to cause the SHB4 sample and hold block 274 within the second comparators 120 to sample data from SDAC reference input 281 on line 42 as shown in FIGS. 2 and 11.

g. Timing circuit 50 generates timing signals on lines 56 and 211–214 to cause the compare circuits 210 within the second comparators 120 to use the SHB3 (SDAC reference input) and SHB3 (analog input) signals to produce outputs on lines 72 and 117 as shown in FIG. 11.

h. The results from the first comparators 110 and the second comparators 120 pass through the 4×6 RAM 80 to outputs on lines 82 and the 41× RAM 90 to outputs on 92, producing sets of the digital data representing the signals sampled.

Cycle 7:

a. Timing circuit 50 generates timing signals on lines 216 and 212 to cause the SHB1 sample and hold blocks 274 within the first comparators 110 to sample data from reference input 46 and analog input 12 as shown in FIGS. 2 and 10.

b. Timing circuit 50 generates a timing signal on line 229 to cause the SHB1 sample and hold block 274 within the second comparators 120 to sample the analog input 12 signal as shown in FIGS. 2 and 11.

c. Timing circuit 50 generates timing signals on lines 56 and 211–214 to cause the compare circuits 210 within the first comparators 110 to produce their outputs on lines 22, 23 or 62 and line 116 as shown in FIG. 10.

d. Timing circuit 50 generates a timing signal on line 233 to cause the SHB1 sample and hold block 274 within the second comparators 120 to sample data from SDAC reference input on 281 on line 42 as shown in FIGS. 2 and 11.

e. The outputs from the first flash converter 20 on lines 43 enable the thermometer code digital to analog converter 40 to produce the SDAC reference inputs 281 carried to the second flash converter 30 on lines 42.

f. Timing circuit 50 generates timing signals on lines 56 and 211–214 to cause the compare circuits 210 within the second comparators 120 to use the SHB4 reference input SDAC and analog input SHB4 signals to produce outputs on lines 72 and 117 as shown in FIG. 11.

g. The results from the first comparators 110 and the second comparators 120 pass through the 4×6 RAM 80 to outputs on lines 82 and the 4×1 RAM 90 to outputs on 92, producing the digital data representing the signals sampled.

h. Timing circuit 50 generates timing signals on lines 215 and 222 to cause the SHB1 sample and hold blocks 274 to present data to the compare circuit 210 within the first comparators 110 as shown in FIGS. 2 and 10.

i. Timing circuit 50 generates timing signals on lines 56 and 211–214 to cause the compare circuits 210 within the first comparators 110 to produce their outputs on lines 22, 23 or 62 and line 116 as shown in FIG. 10.

j. Timing circuit 50 generates timing signal on analog input lines 218 and reference input 219 to cause the SHB2 sample and hold blocks 274 within the first comparators 110 to sample data from reference input 46 and analog input 12 as shown in FIGS. 2 and 10.

k. Timing circuit 50 generates a timing signal on the analog input line 223 to cause the SHB2 sample and hold blocks 274 within the second comparators 120 to sample data from the analog input 12 as shown in FIGS. 2 and 11.

l. The outputs from the first flash converter 20 on lines 43 enable the thermometer code digital to analog converter 40 to produce the SDAC reference inputs 281 carried to the second flash converter 30 on lines 42.

m. Timing circuit 50 generates a timing signal on line 235 to cause the SHB3 sample and hold block 274 within the second comparators 120 to sample data from SDAC reference input 281 on line 42 as shown in FIGS. 2 and 11.

n. Timing circuit 50 generates timing signals on lines 56 and 211–214 to cause the compare circuits 210 within the second comparators 120 to use the SHB2 (SDAC reference input) and SHB2 (analog input) signals to produce outputs on lines 74 and 117 as shown in FIG. 11.

o. The results from the first comparators 110 and the second comparators 120 pass through the 4×6 RAM 80 to outputs on lines 82 and the 4×1 RAM 90 to outputs on 92, producing the digital data representing the signal samples in the SHB4s of comparators 110 and 120.

The pipeline then continues to produce these output values every clock cycle. Note the latency between when the data is sampled and when the data is output on lines 82 and 92 due to the action of the pipeline is four clock cycles.

Figure 14:
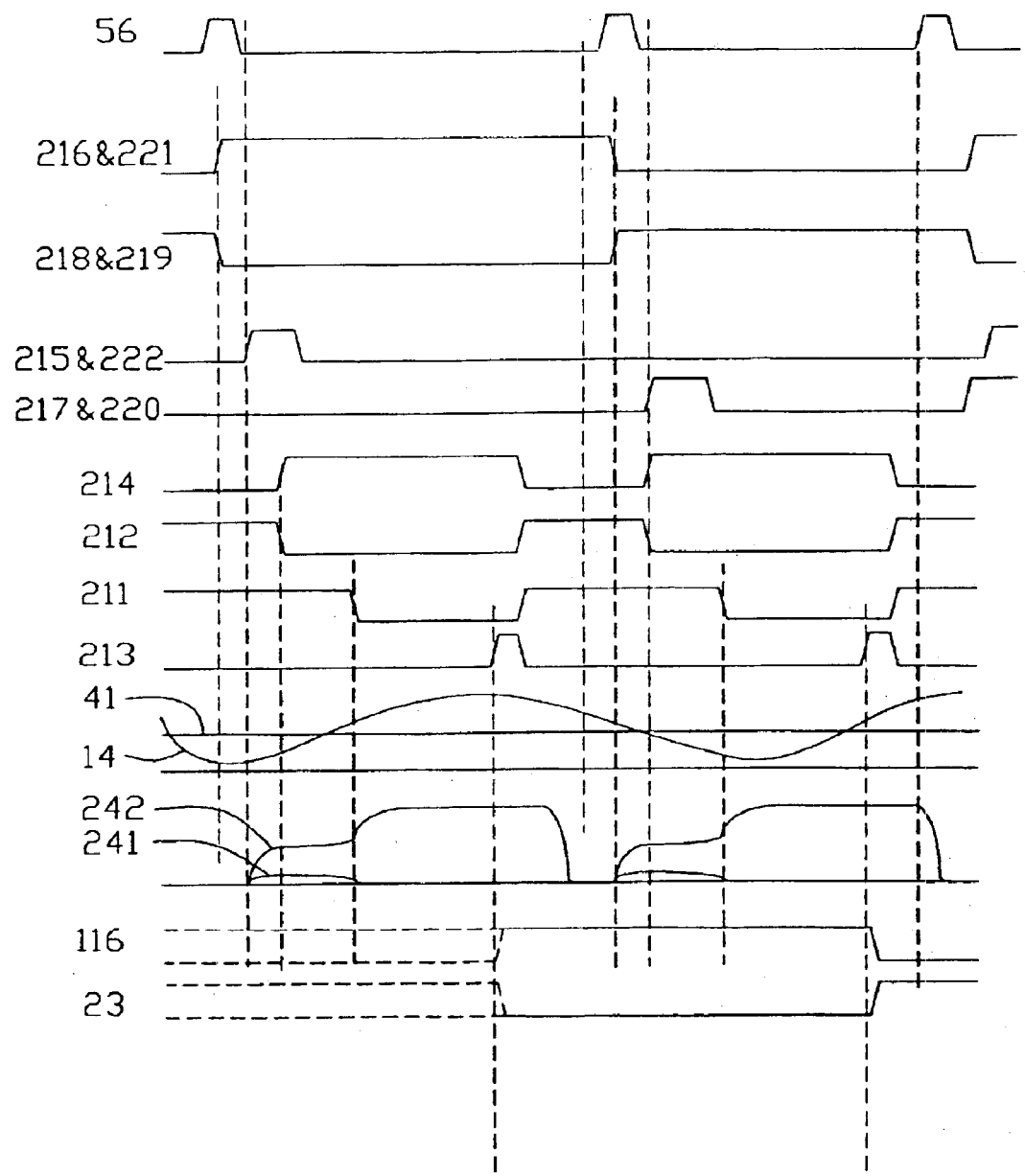
FIG. 14 is a timing diagram of the primary signals involved in the conversion of sampled analog and reference inputs to digital values, showing two conversion cycles.

FIG. 14 shows two conversion cycles in the first comparators 110. Specifically, the cycles show the conversion of analog data from the SHB1s (first cycle) and SHB2s (second cycle) to digital values in the compare circuit 210.

These conversions occur with the following steps:

a. The comparator circuit 210 is reset by signal 56 from timing circuit 50 as shown in FIG. 12.

b. The rising edge of signals on lines 216 and 221 from timing circuit 50 cause the first analog switch in the SHB1s 274 of the first compare block 270 to sample the analog input 12 on line 14 and the reference input 46 on line 41, respectively as shown in FIG. 10.

c. The rising edge of signals on lines 215 and 222 from timing circuit 50 cause the first analog switch in the SHB1s 274 of the first compare block 270 to output their sampled signals to the compare circuit 210 on lines 241 and 242, respectively as shown in FIG. 10.

d. During the high level on lines 215 and 222 from timing circuit 50, the comparator circuit 210 starts the initial comparison (amplification of the difference between the voltages on lines 241 and 242) by turn on of transistors 252 activated by the rising edge of a signal on line 214 and the falling edge of a signal on line 212 from timing circuit 50 as shown in FIG. 12.

e. After a brief time during which the charge transfer to the capacitance of the transistors 252 and the initial comparison begins, the falling edge of the signals on lines 215 and 222 isolate lines 241 and 242 as shown in FIGS. 10 and 12.

f. The falling edge of the signal on line 211 from timing circuit 50 turns on the connected transistor 252 which provides the maximum amplification to the circuit 210 during the conversion cycle. The effects of this can be seen in the increase in the signal on line 242 and the decrease in signal on line 241 at that time.

g. Shortly after this time, during which these differences stabilize to logic level voltages, a signal on line 213 from timing circuit 50 acts to latch the signals on lines 241 and 242 into the NAND gates 251 arranged in a latch circuit. This NAND gate-based latch circuit produces outputs on lines 22, 23 or 62 (true) and lines 116 or 117 (compliment). Note that this same comparator circuit produces outputs on lines 72 and 117 when it acts in the second comparators 120.

h. This is the end of the first two conversion cycles shown in FIG. 14. At this point, the reset signal on line 56 from timing circuit 50 repeats and the conversion cycle begins again.

In this example, where the reference input signal shown on line 41 is greater than the analog input signal shown on line 14 at the time of sampling by signals 216, 221, 218 and 219 as shown in FIG. 14. The amplification of the difference between the voltages on lines 241 and 242 will result in lines 241 and 242 ultimately attaining the voltages equal to VDD and GND (logic levels 1 and 0, respectively) at the end of each conversion cycle.

A. Voltage Reference Steering

The present invention minimizes the number of voltage comparators required through a technique called voltage reference steering. In a pure flash-type analog-to-digital converter, one comparator circuit is required for each voltage level to be discriminated. For an 8-bit analog-to-digital converter able to resolve 256 voltage levels, the flash-type analog-to-digital converter requires 256 comparator circuits. The voltage steering invention described herein allows an 8-bit analog-to-digital converter with 256 voltage levels to be constructed with thirty-two comparators including two comparators for over-range signals and under-range signals. The reduction of the number of voltage comparators provides a significant saving in circuit power and circuit area. Since the action of voltage reference steering requires time to accomplish, an additional amount of circuitry is required to support circuits used to re-synchronize the consequences of references separated in time.

FIGS. 3–5, 10, 11 and 13 show the operation of the voltage reference system employed in this design that incorporates the voltage steering circuitry. A high voltage reference signal 31 is presented to the thermometer code digital-to-analog-converter 40 on line 33. A low voltage reference signal 32 is presented to the thermometer code digital-to-analog converter 40 on line 34. The voltage difference between the high voltage reference signal 31 and the low voltage reference signal 32 is divided across 256 resistors grouped into 16 subsidiary digital-to-analog-converters 140. Each of the subsidiary digital to analog converters, 140 has 16 voltage signals presented on 16 output lines that feed a 16 signal bus consisting of lines 42. Analog switches 152 control the application of voltage signals to the lines 42. Only one subsidiary digital-to-analog converter 150 is active during any one analog-to-digital converter circuit 10 cycle. Therefore, only one set of 16 analog switches 152 enable their corresponding 16 voltage signals to be present on lines 42 at a time.

The operation of the circuit can best be understood with reference to FIGS. 3 and 10. The timing circuit 50 produces signals on lines 215–222 that enable the analog input signal 12 on line 14 and the reference input signal 46 on line 41 to be sampled by sample and hold blocks 274 within the comparators 110 of the first flash converter 20. This step is shown to occur in cycle 1 of FIG. 13, indicated by the blocks labeled SHB1 in the upper part of the FIG. 13.

In cycle 2 of FIG. 13, the signals captured by the blocks SHB1 are presented to the compare circuits 210 within the comparators 110.

In cycle 3 of FIG. 13, the outputs of comparators 110 on lines 23/62 and 116 are presented to NAND gates 114 as shown in FIG. 4. The outputs of NAND gates 114 are presented on lines 43 to the subsidiary digital to analog converters 140. Since only one of the 16 NAND gates 114 will have a high logic level signal, only one of the 16 subsidiary digital-to-analog converters 140 and corresponding analog switches 152 presents their 16 voltage signals on lines 42 to the second flash converter 30 during cycle 3. This is shown by the arrow from the COMP block of cycle 2 connecting SHB1 block if FIG. 13 during cycle 3. The production of the one in sixteen selection signal and the corresponding subsidiary digital-to-analog converter selected voltage signals "steers" the correct range of voltage signals to the comparators 120.

Cycle 4 as shown in FIG. 13 shows the completion of the compare operation for the comparators 120 in the second flash converter stage 30. The analog input signal 12 sampled in cycle 1 is used in cycle 4 to compare against the "steered" reference signal 281 produced on line 42 during cycle 3 as shown in FIGS. 13 and 11. This process continues as shown in FIG. 13, indicating how valid output data on lines 82 and 92 are produced with a latency of four clock cycles.

B. High Performance Low Power Comparator Circuit

The present invention is incorporated into a novel comparator circuit 210 and method of comparison for quickly comparing low voltage differences with the minimum use of power. In general, the comparison speed of any comparator circuit establishes the overall speed limits of an analog-to-digital converter. In addition, the power consumed in a comparison operation of a comparator circuit is related to the overall power consumed by the analog-to-digital converter since an array of comparator circuits are used in an analog-to-digital converter.

FIGS. 10, 11, 12 and 14 illustrate the operation of the comparator circuit 210. The timing signals 56 and 211–214 are supplied by timing circuit 50. The analog compensation signals 241 and reference compensation signals 242 are supplied by the compensation circuits 260 and the sample and hold blocks 274. The outputs of the comparator circuit 210 are fed on lines 23, 72, 116 and 117 to the analog-to-digital converter circuit 10.

The comparator circuit 210 comprises a first comparator stage 252, a second stage comparator stage 254 and an output latch 251. The combination of the first comparator stage 252, the second stage comparator stage 254 and the output latch 251 provide the high comparison speed and accurate result of the comparator circuit 210.

The first comparator stage 252 comprises PFET transistors 252A and 252B. The PFET transistors 252A is constructed to be physically smaller than PFET transistors 252B as shown. The first comparator stage 252 provides a first amplification at a lower gain and at an initial slower rate. The initial slower rate is desirable to accommodate for noise or distortion, noise at peak or valley to amplify and smoothing out noise. The first amplification at lower gain and at an initial slower rate occurs between the falling time 212 and the falling time 211 in FIG. 14.

The first part of the amplification occurs after the reset state established by line 56 transitioning from RESET (low voltage) to OPERATION (high voltage). The first stage of amplification occurs when line 212 goes low as shown in FIG. 14. This enables a brief, low-gain amplification of the signals on lines 241 and 242. The purpose of this low-gain amplification is to minimize the amplification of noise on lines 241 and 242 as the noise settle after being "loaded" by the sample and hold blocks 274 and compensation circuits 260 through the action of lines 215–230 from timing circuit 50.

The second comparator stage 254 comprises NFET transistors 254A–254B. The PFET transistors 254A–254B are connected to the compensated analog input signal 256 on line 241 and the compensated reference input signal 258 on line 242. The second comparator stage 254 provides a second amplification at a higher gain and at a higher rate. The second stage of amplification occurs when line 211 goes low as shown in FIG. 14. The relatively larger-sized PFET 252 controlled by line 211 give a high gain to the signals on lines 241 and 242. This second, high-gain amplification stage quickly brings the signals on lines 241 and 242 to the appropriate high or low logic voltage level.

The final action of the comparator 210 is the latching circuit 251 of these logic-level voltages in the latch made from NAND gates 251A–251B. The high voltage on line 213 as shown in FIG. 14 indicates when this latching action takes place relative to the first and second stage amplifications 252 and 254. Then the RESET value is reasserted on line 56 to start the comparison cycle over again. The output from the latch circuit 251 is provided on output lines 23, 74, 116 and 117.

The combination of low-gain, low-noise first amplification 252 and high-gain amplification stages 254 are the key to the rapid and accurate operation of the comparator 210. The comparator uses a slow set to obtain very accurate resolution and a secondary fast set to obtain the high performance.

The low power consumption of the comparator circuit 210 is due to the configuration of the comparator circuit 210. The configuration of the first comparator stage 252 and the second comparator stage 254 are normally in a non-conducting state during an absence of a signal on line 211. Furthermore, during the conducting state of the comparator circuit 210 there is no direct conduction between the power source and ground.

The low power consumption of the comparator 210 is achieved through the use of dynamic control where the connections to VDD supply and ground are kept to a short part of the comparison cycle which, therefore, minimizes power consumption due to static current. During the conducting state of the comparator circuit 210, the current is conducted to the latch circuit 251 rather than being conducted directly to ground. The low power is accomplished by eliminating all DC (continuous) current flow and by minimizing the time duration that switching nodes are at an intermediate state other than $V_{dd}$ or ground.

C. Digital Calibration for Compensation

The present invention is incorporated into a novel compensation circuit 260 for improving the accuracy of the analog-to-digital converter 10. The compensation circuit 260 improves the accuracy of the analog-to-digital converter 10 through the use of digitally programmed compensation.

The comparator circuit 210 shown in FIG. 12 and the sample and hold circuit 110 shown in FIGS. 10 and 11 are connected to the compensation circuits 260 shown as the switched capacitor array 260 shown in FIGS. 8 and 9. The switched capacitor array 260 compensates the internal comparator signal for offset conditions existing due to manufacturing variations or changes in internal or external circuit parameters during operational lifetime of the analog to digital conventer. The reference voltages or the input signal voltages may be initially out of balance due to changes arising from fabrication differences, aging, temperature of the analog-to-digital converter 10. The reference voltages or the input signal voltages may be initially out of balance due to the effects of external circuitry.

The array of capacitors 260 can generate a variable binary internal signal to provide a wide range of compensation for the analog to digital converter 10. This form of compensation can be used for correcting an offset for individual comparators using local compensation memory 250 and connected circuits as shown in FIG. 9. In addition, this form of compensation can be used for as a systemic offset that affects the bank of comparators 110 and 120 using global compensation memory 130 and connected circuits as shown in FIG. 8. The memory contained within in the compensation circuit defined which capacitors are selected from the bank.

FIGS. 5, 6, 7 and 8 show the compensation of comparators 110 and 120 through the action of compensation circuits 260. The compensation circuits 260 comprises an externally-programmed local compensation memory 250 formed from serial in/parallel-out shift registers.

The voltages produced on the outputs 246 of the local compensation memory 250. The outputs 246 of the local compensation memory 250 enable a set of pass transistors 240. The set of pass transistors 240 connect minimum trim capacitors (MTC) 264 and/or variable trim capacitors (VTC) 262 to influence the voltage attained by the analog compensation signal 243 on line 241 and reference compensation signal 244 on line 242.

The capacitance values of the capacitors 264 and 262 are controlled so the difference in capacitance between those capacitors selected on the reference compensation signal and analog compensation signal creates a difference in voltage between those two signals. The difference in capacitance between those capacitors is controlled through careful capacitor physical design. This difference voltage achieves the desired compensation and brings the input voltage and reference signal back into relative balance for more accurate analog-to-digital conversion.

The sample and hold circuit 274 converts the differential input voltage signal to charge differential that can be altered by applying differential capacitance on the input lines 241 and 242 of FIGS. 6–12.

The compensation circuits 260 compensates for integral non-linearity of the total system of the analog to digital converter 10 as well as compensates for differential non-linearity of each component of the total system of the analog to digital converter 10. The compensation circuits 260 accomplishes this compensation by switching in digitally stored value of capacitance. There is no physical change of the value of components as undertaken by the prior art.

D. Low Power Hybrid.

The analog to digital converter 10 uses flash converters 20 to produce the most significant bits and a charge sharing pipelined chain converter 40 and 30 to produce the least significant bits. The low power is accomplished through low power compare circuits, timing controlled sample and hold circuits that are common to all comparators and the use of a low power RAM with the converted data for proper alignment.

The present invention incorporates three important circuits including a novel voltage reference steering circuit, a novel high performance low power comparator circuit and a digital calibration for compensation circuit.

The present invention provides an improved analog to digital converter that overcomes the deficiencies of the analog to digital converters of the prior art and provides a significant advancement to the electrical conversion art. The improved analog to digital converter operates without the use of DC circuits for reducing operating power. The improved analog to digital converter may operate at a very low power level in the order of 50 $\mu$W/M hz-Bit.

The invention incorporates an eight bit two stage pipeline flash converter instead of serial or parallel processing. The improved analog to digital converter is capable of operating up to ten channels at 100 Mhz. Furthermore, the improved analog to digital converter is capable of extendability in excess ten bits of resolution.

The improved analog to digital converter is compatible for incorporating within large-scale integrated circuits and is scalable form 0.5 $_\mu$M to 0.1 $_\mu$M The invention includes a calibration for compensating for variations incurred during the manufacturing processes. The invention incorporates a test and calibration for compensating for variations incurred during operation of the improved making analog to digital converter.

The present disclosure includes that contained in the appended claims as well as that of the foregoing description. Although this invention has been described in its preferred form with a certain degree of particularity, it is understood that the present disclosure of the preferred form has been made only by way of example and that numerous changes in the details of construction and the combination and arrangement of parts may be resorted to without departing from the spirit and scope of the invention.

What is claimed is:

1. An analog to digital converter for converting an analog signal into a digital signal, comprising:
    an input circuit;
    a reference circuit for generating a series of reference signals;
        a first converter connected to said imput circuit and said reference circuit for comparing said input signal to said reference signals for determining the most significant digital value of said input signal; and
        a second converter connected to said input circuit and said reference circuit and said first converter, said second converter further comprising a charge sharing pipelined chain converter for comparing said input signal to said reference signals for determining the least significant digital value of said input signal;
    wherein said input circuit includes a sample and hold circuit for storing the input signal during the period said first converter is determining the most significant digital value of said input signal; and
    said sample and hold circuit storing the input signal during the period said second converter is determining the least significant digital value of said input signal.

2. An analog to digital converter for converting an analog signal into a digital signal as set forth in claim 1, wherein said reference circuit includes a voltage divider for generating a series of reference signals.

3. An analog to digital converter for converting an analog signal into a digital signal as set forth in claim 1, wherein said first converter comprises a flash converter for determining the most significant digital value of said input signal.

4. An analog to digital converter for converting an analog signal into a digital signal as set forth in claim 1, wherein said first converter determines only the most significant digital value of said input signal; and
    a second converter determines only the least significant digital value for said most significant digital value determined by said first converter.

5. An analog to digital converter for converting an analog signal into a digital signal as set forth in claim 1, wherein said first converter determines only the most significant digital value of said input signal;
    a second converter determines only the least significant digital value for said most significant digital value determined by said first converter; and
    a multiplicity of said the least significant digital values being equal to one of said most significant digital values.

6. An analog to digital converter for converting an analog signal into a digital signal as set forth in claim 1, including an improved comparator circuit for comparing the input signal to the reference signal.

7. An improved compensation circuit for improving the accuracy of an operating circuit, comprising:
    an array of capacitors for generating a variable binary internal signal to provide a wide range of compensation for the operating circuit;
    an array of memories;
    an array of switches interconnecting said array of capacitors to said array of memories; and
    said array of switches interconnecting selective capacitors of said array of capacitors to selected memories of said array of memories for improving the accuracy of an operating circuit.

8. An improved compensation circuit for improving the accuracy of an operating circuit as set forth in claim 7 wherein said compensation circuits compensates for integral non-linearity of the total operating circuit as well as for differential non-linearity of each component at the total operating circuit.

9. An analog to digital converter for converting an analog signal into a digital signal, comprising:
    an input circuit;
    a reference circuit for generating a series of reference signals;
        a first converter connected to said input circuit and said reference circuit for comparing said input signal to said reference signals for determining the most significant digital values of said input signal; and
        a second converter connected to said input circuit and said reference circuit and said first converter, said second converter further comprising a charge sharing pipelined chain converter for comparing said input signal to said reference signals for determining the least significant digital value of said input signal.

10. An analog to digital converter for converting an analog signal into a digital signal as set forth in claim 9, wherein said input circuit includes a sample and hold circuit for storing the input signal.

11. An analog to digital converter for converting an analog signal into a digital signal as set forth in claim 9, wherein said input circuit includes a sample and hold circuit for storing the input signal during the period said first converter is determining the most significant digital value of said input signal; and
    said sample and hold circuit storing the input signal during the period said second converter as determining the least significant digital value of said input signal.

12. An analog to digital converter for converting an analog signal into a digital signal as set forth in claim 9, wherein said reference circuit includes a voltage divider for generating a series of reference signals.

13. An analog to digital converter for converting an analog signal into a digital signal as set forth in claim 9, wherein said first converter comprises a flash converter for determining the most significant digital value of said input signal.

14. An analog to digital converter for converting an analog signal into a digital signal as set forth in claim 9, wherein said first converter determines only the most significant digital value of said input signal; and a second converter determines only the least significant digital value for said most significant digital value determined by said first converter.

15. An analog to digital converter for converting an analog signal into a digital signal as set forth in claim 9, wherein said first converter determines only the most significant digital value of said input signal;

a second converter determines only the least significant digital value for said most significant digital value determined by said first converter; and a multiplicity of said the least significant digital values being equal to one of said most significant digital values.

16. An analog to digital converter for converting an analog signal into a digital signal as set forth in claim 9, including an improved comparator circuit for comparing the input signal to the reference signal.

17. An analog to digital converter for converting an analog signal into a digital signal as set forth in claim 9, including an improved digital calibration circuit for improving the accuracy of the analog to digital converter.

* * * * *